United States Patent
Chia et al.

(10) Patent No.: US 11,963,363 B2
(45) Date of Patent: Apr. 16, 2024

(54) MEMORY DEVICE AND METHOD FOR FABRICATING THE SAME

(71) Applicant: Taiwan Semiconductor Manufacturing Company, Ltd., Hsinchu (TW)

(72) Inventors: Han-Jong Chia, Hsinchu (TW); Meng-Han Lin, Hsinchu (TW); Yu-Ming Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 141 days.

(21) Appl. No.: 17/163,574

(22) Filed: Feb. 1, 2021

(65) Prior Publication Data

US 2022/0020774 A1    Jan. 20, 2022

Related U.S. Application Data

(60) Provisional application No. 63/051,880, filed on Jul. 14, 2020.

(51) Int. Cl.
*H10B 51/20* (2023.01)
*G11C 11/22* (2006.01)
*H10B 51/10* (2023.01)
*H10B 51/40* (2023.01)

(52) U.S. Cl.
CPC .......... *H10B 51/20* (2023.02); *G11C 11/2255* (2013.01); *G11C 11/2257* (2013.01); *H10B 51/10* (2023.02); *H10B 51/40* (2023.02)

(58) Field of Classification Search
CPC ............. G11C 11/2255; G11C 11/2257; H01L 27/11587; H01L 27/1159; H01L 27/11592; H01L 27/11597; H01L 29/6684; H01L 29/78391; H10B 51/10; H10B 51/20; H10B 51/30; H10B 51/40
See application file for complete search history.

(56) References Cited

U.S. PATENT DOCUMENTS

2020/0185411 A1* 6/2020 Herner .............. H01L 27/11578
2020/0381450 A1* 12/2020 Lue ........................ H01L 23/528
2021/0175235 A1* 6/2021 Yamazaki ......... H01L 29/78648

* cited by examiner

*Primary Examiner* — Meiya Li
(74) *Attorney, Agent, or Firm* — JCIPRNET

(57) ABSTRACT

A memory device including a word line, memory cells, source lines and bit lines is provided. The memory cells are embedded in and penetrate through the word line. The source lines and the bit lines are electrically connected the memory cells. A method for fabricating a memory device is also provided.

15 Claims, 27 Drawing Sheets

MEMORY DEVICE AND METHOD FOR FABRICATING THE SAME

CROSS REFERENCE AND PRIORITY CLAIM

This application claims the priority benefit of U.S. provisional application Ser. No. 63/051,880, filed on Jul. 14, 2020. The entirety of the above-mentioned patent application is hereby incorporated by reference herein and made a part of this specification.

BACKGROUND

Semiconductor memory devices are widely used in integrated circuits for electronic applications, including radios, televisions, cell phones, and personal computing devices, as examples. Semiconductor memories include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered. On the other hand, non-volatile memories can keep data stored on them. One type of non-volatile semiconductor memory is Ferroelectric random access memory (FeRAM). Advantages of FeRAM include its fast write/read speed and small size.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A through FIG. 1L schematically illustrate perspective views of a process flow for fabricating a memory device in accordance with some embodiments of the present application.

DETAILED DESCRIPTION

Figure 1A:
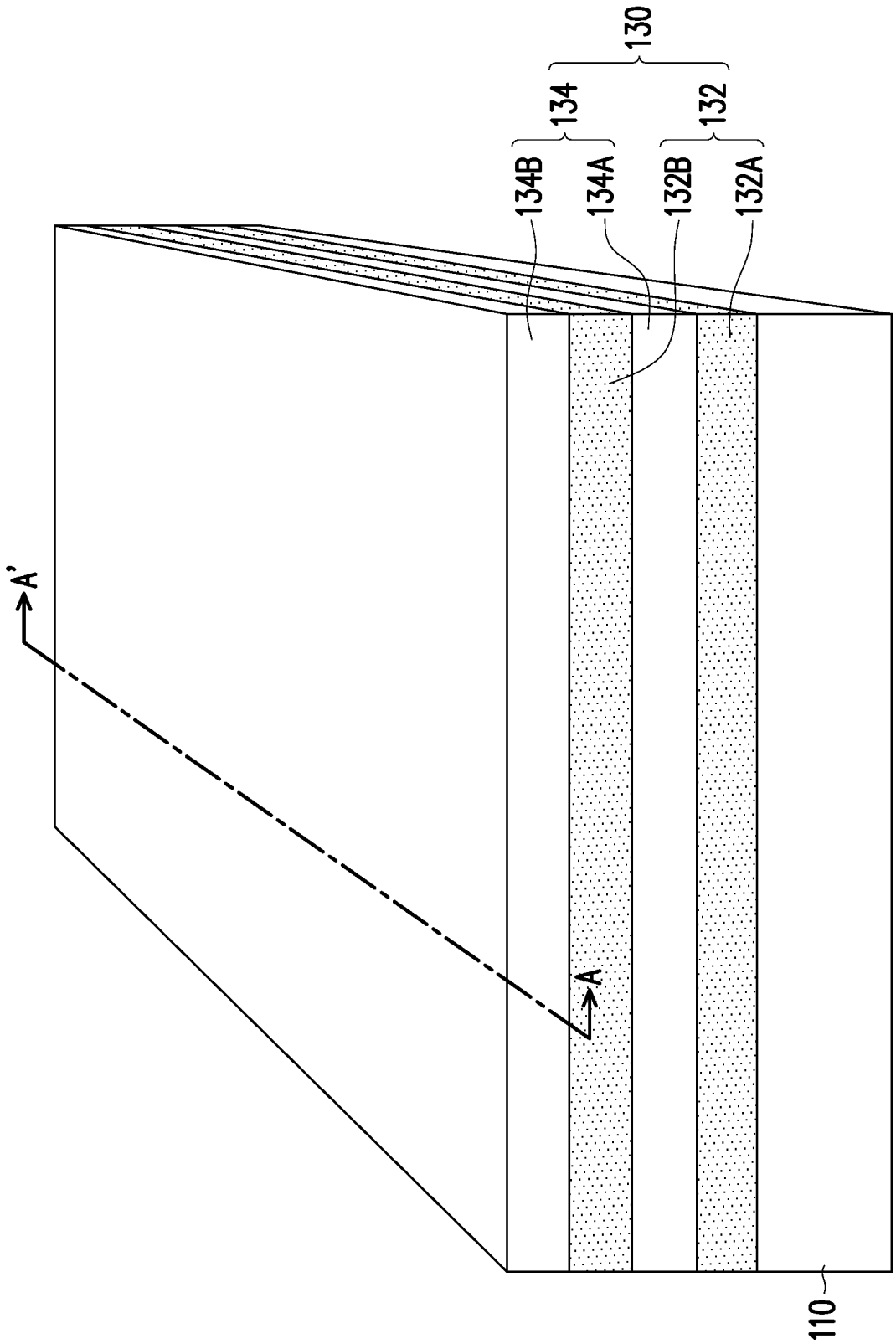

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a memory device such as a three-dimensional (3D) NOR-type memory array. In some embodiments, the 3D NOR-type memory array is a ferroelectric field effect transistor (FeFET) memory circuit including a plurality of vertically stacked memory cells. In some embodiments, each 3D NOR-type memory cell is regarded as a FeFET that includes a word line region acting as a gate electrode, a bit line region acting as a first source/drain electrode, and a source line region acting as a second source/drain electrode, a ferroelectric material as a gate dielectric, and an oxide semiconductor (OS) as a channel region. In some embodiments, each memory cell in the 3D memory array is regarded as a thin film transistor (TFT). In some alternative embodiments, each 3D NOR-type memory cell is regarded as a thin film transistor that includes a word line region acting as a gate electrode, a bit line region acting as a first source/drain electrode, and a source line region acting as a second source/drain electrode, an oxide-nitride-oxide (ONO) stacked structure as a gate dielectric, and a silicon layer as a channel region. Other types of gate dielectric materials and channel material may be utilized.

FIG. 1A through FIG. 1L schematically illustrate perspective views of a process flow for fabricating a memory device in accordance with some embodiments of the present application. FIG. 2A through FIG. 2K schematically illustrates cross-sectional views of a process flow for fabricating a memory device in accordance with some embodiments of the present application. In FIG. 1A through FIG. 1L, a portion of a simplified ferroelectric memory device in a partial three-dimensional view is illustrated. In FIG. 2A through FIG. 2K, a portion of a simplified ferroelectric memory device in a partial cross-sectional view is illustrated.

Figure 2A:
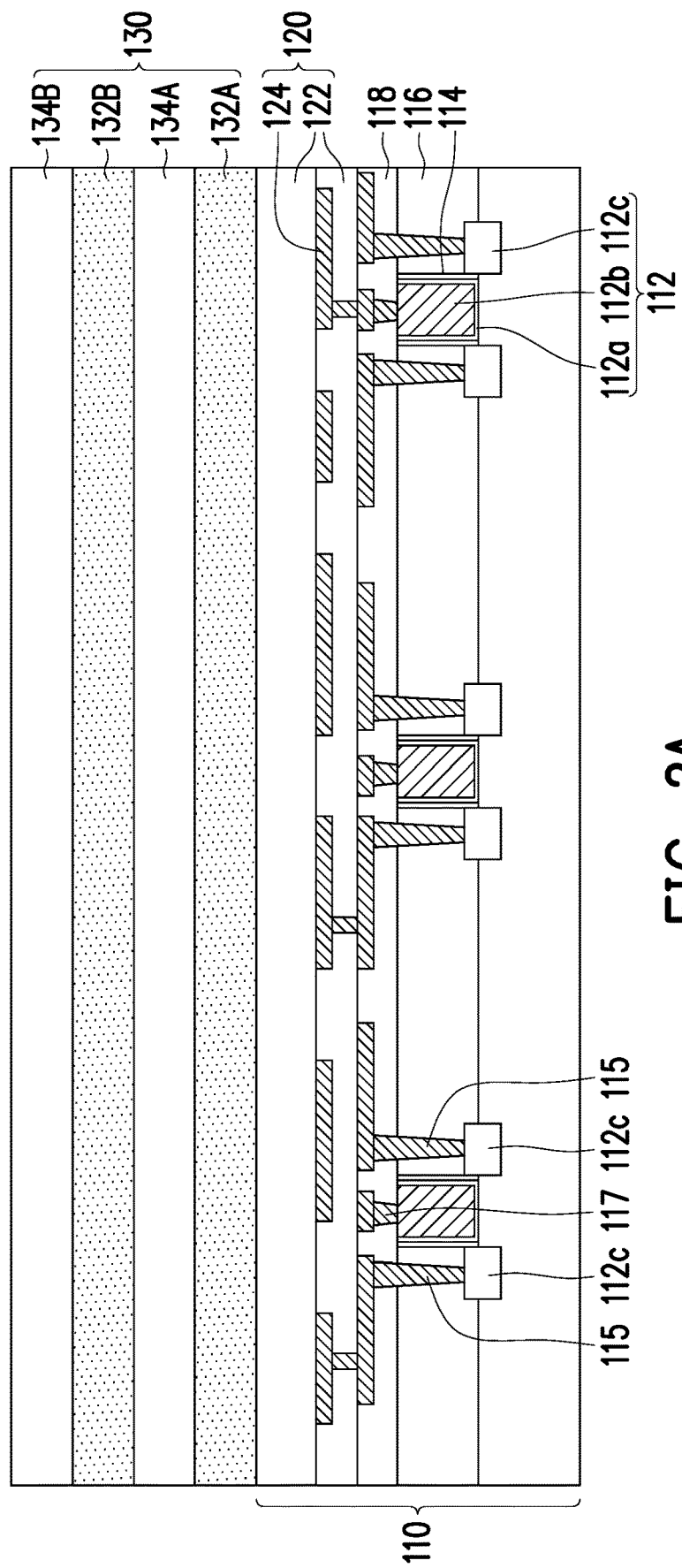
FIG. 2A through FIG. 2K schematically illustrates cross-sectional views of a process flow for fabricating a memory device in accordance with some embodiments of the present application.

FIG. 2A is a cross-sectional view cutting along a cross-sectional line A-A' illustrated in FIG. 1A. Referring to FIG. 1A and FIG. 2A, a substrate 110 is provided. The substrate 110 may be a semiconductor substrate, such as a bulk semiconductor substrate, a semiconductor-on-insulator (SOI) substrate, or the like, which may be doped (e.g., with a p-type or an n-type dopant) or undoped. The substrate 110 may be an integrated circuit die, such as a logic die, a memory die, an Application-specific integrated circuit (ASIC) die, or the like. The substrate 110 may be a complementary metal oxide semiconductor (CMOS) die and may be referred to as a CMOS under array (CUA). The substrate 110 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 110 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

FIG. 2A further illustrates circuits that may be formed over the substrate 110. As illustrated in FIG. 2A, the circuits include transistors 112 formed at a top surface of the substrate 110. The transistors may include gate dielectric layers 112a over top surfaces of the substrate 110 and gate electrodes 112b over the gate dielectric layers 112a. Source/drain regions 112c are disposed in the substrate 110 on opposite sides of the gate dielectric layers 112a and the gate electrodes 11b. Gate spacers 114 are formed along sidewalls of the gate dielectric layers 112a and separate the source/drain regions 112c from the gate electrodes 112b by appropriate lateral distances. The transistors 112 may include fin field effect transistors (FinFETs), nanostructure (e.g., nanosheet, nanowire, gate-all-around, or the like) FETS (nano-FETs), planar FETs, the like, or combinations thereof, and may be formed by gate-first processes or gate-last processes. In some alternative embodiments, the circuits include transistors 112 fabricated through front end of line (FEOL) processes and transistors fabricated through back end of line (BEOL) processes, wherein the front-end transistors 112 are formed under a dielectric stack 130, and the back-end transistors (e.g., thin film transistors) are formed over the front-end transistors 112. For example, the back-end transistors and the dielectric stack 130 may be formed through back end of line (BEOL) processes.

A first inter-layer dielectric (ILD) layer 116 surrounds and isolates the source/drain regions 112c, the gate dielectric layers 112a, and the gate electrodes 112b, and a second ILD layer 118 is over the first ILD layer 116. Source/drain contacts 115 extend through the second ILD layer 118 and the first ILD layer 116 and are electrically coupled to the source/drain regions 112c and gate contacts 117 extend through the second ILD layer 118 and are electrically coupled to the gate electrodes 11b. An interconnect structure 120 is over the second ILD layer 118, the source/drain contacts 115, and the gate contacts 117. The interconnect structure 120 includes one or more stacked dielectric layers 122 and conductive features 124 formed in the one or more dielectric layers 122, for example. The interconnect structure 120 may be electrically connected to the gate contacts 117 and the source/drain contacts 115 to form functional circuits. In some embodiments, the functional circuits formed by the interconnect structure 120 may include logic circuits, memory circuits, sense amplifiers, controllers, input/output circuits, image sensor circuits, the like, or combinations thereof. Although FIG. 2A discusses transistors formed over the substrate 110, other active devices (e.g., diodes or the like) and/or passive devices (e.g., capacitors, resistors, or the like) may also be formed as part of the functional circuits.

In FIG. 1A, a dielectric stack 130 is formed over the interconnect structure 120 of the substrate 110. The transistors 112, the gate spacers 114, the first ILD layer 116, the second ILD layer 118, and the interconnect structure 120 of the substrate 110 are omitted in FIG. 1A through FIG. 1L for the purposes of simplicity and clarity. Although the dielectric stack 130 is illustrated as contacting the dielectric layers 124 of the interconnect structure 120, any number of intermediate layers may be disposed between the substrate 110 and the dielectric stack 130. For example, one or more interconnect layers including conductive features in insulting layers (e.g., low-k dielectric layers) may be disposed between the substrate 110 and the dielectric stack 130. In some embodiments, the conductive features may be patterned to provide power, ground, and/or signal lines for the active devices on the substrate 110 and/or ferroelectric memory cells 140.

The dielectric stack 130 may include alternating layers of sacrificial dielectric layers 132A and 132B (collectively referred to as sacrificial layers 132) and dielectric layers 134A and 134B (collectively referred to as dielectric layers 134). The sacrificial dielectric layers 132 may be patterned and replaced in subsequent steps to define conductive lines (e.g., the word lines). The sacrificial dielectric layers 132 may include dielectric materials, such as silicon oxide, silicon nitride, silicon oxynitride, combinations thereof, or the like. The dielectric layers 134 may include insulating materials, such as silicon oxide, silicon nitride, silicon oxynitride, combinations thereof, or the like. The sacrificial dielectric layers 132 and the dielectric layers 134 include different materials with different etching selectivities. In some embodiments, the sacrificial dielectric layers 132 include silicon nitride, and the dielectric layers 134 include silicon oxide. Each of the sacrificial dielectric layers 132 and the dielectric layers 134 may be formed using, for example, chemical vapor deposition (CVD), atomic layer deposition (ALD), physical vapor deposition (PVD), plasma enhanced CVD (PECVD), or the like.

Although FIG. 1A and FIG. 2A illustrate a particular number of the sacrificial dielectric layers 132 and the dielectric layers 134, other embodiments may include different numbers of the sacrificial dielectric layers 132 and the dielectric layers 134. In some embodiments, as illustrated in FIG. 1A and FIG. 2A, the bottommost layer of the dielectric stack 130 is a sacrificial layer 132A. In some alternative embodiments, not illustrated in figures, the topmost layer of the dielectric stack 130 is a sacrificial dielectric layer. In some other embodiments, not illustrated in figures, the dielectric stack 130 has dielectric layers as topmost and bottommost layers. In some embodiments, the dielectric stack 130 includes two sacrificial dielectric layers 132 and three dielectric layers 134, wherein the two sacrificial dielectric layers 132 are sandwiched by the three dielectric layers 134, a bottom tier sacrificial dielectric layer 132 is sandwiched by a bottom tier dielectric layer 134 and a middle tier of the dielectric layer 134, and a top tier sacrificial dielectric layer 132 is sandwiched by the middle tier dielectric layer 134 and a top tier dielectric layer 134.

Figure 1B:
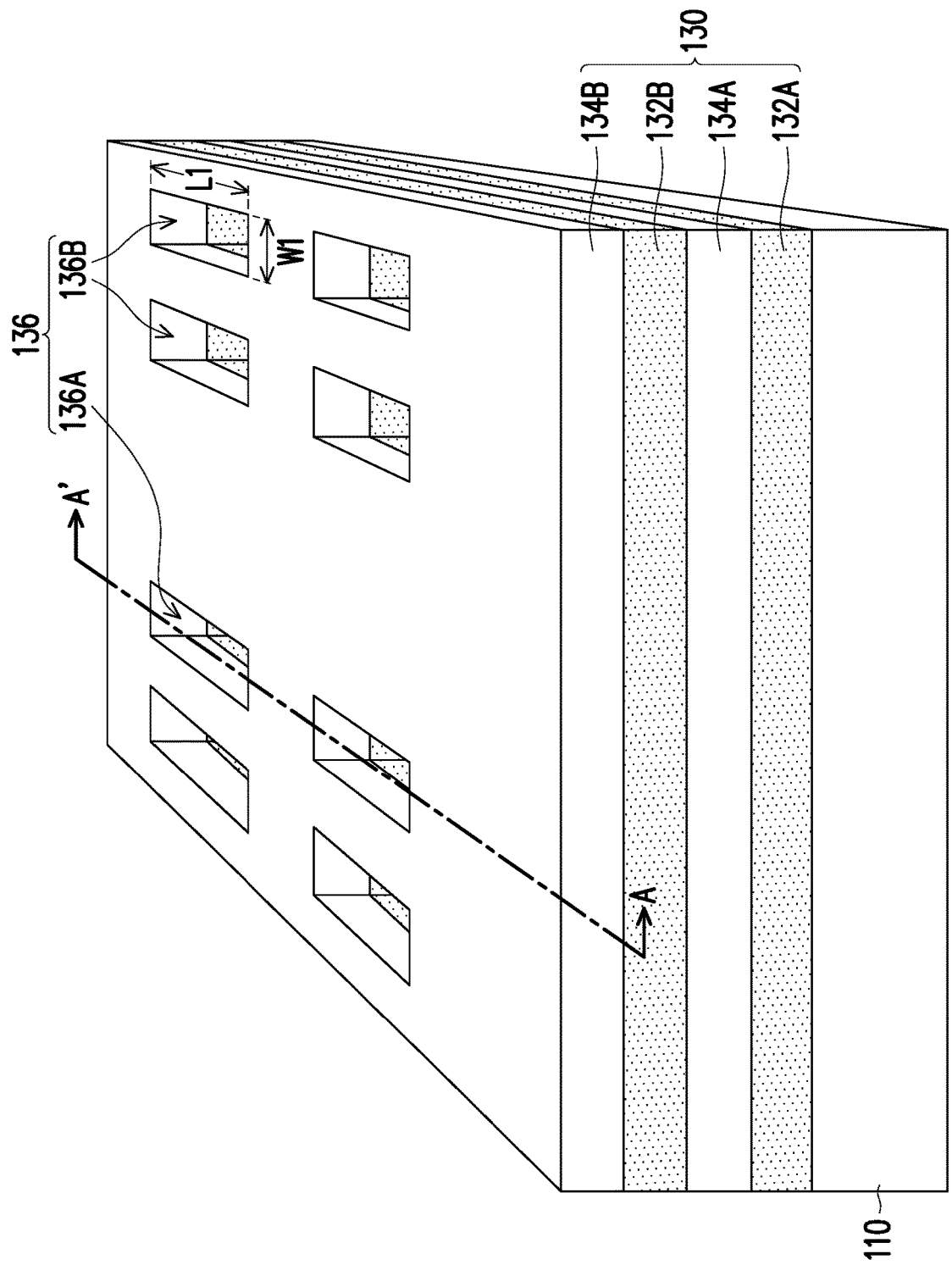
Figure 2B:
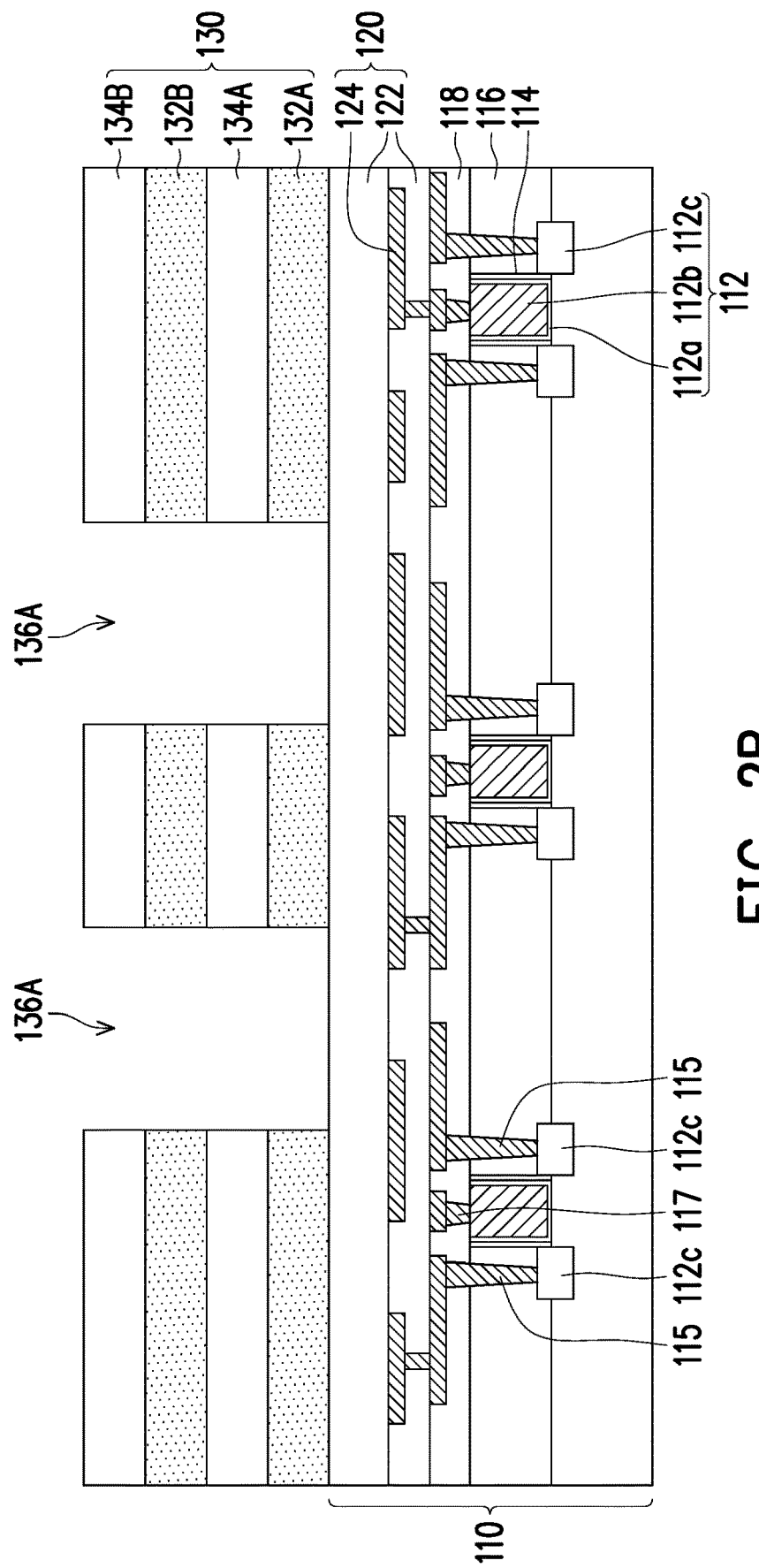

FIG. 2B is a cross-sectional view cutting along a cross-sectional line A-A' illustrated in FIG. 1B. Referring to FIG. 1B and FIG. 2B, a group of through holes 136A and a group of through holes 136B (collectively referred to as through holes 136) are formed in the dielectric stack 130 to reveal portions of the interconnect structure 120. Although FIG. 1B illustrates two groups of through holes 136A and 136B, other embodiments may include different numbers of the groups of the through holes 136. The through holes 136 formed in the dielectric stack 130 are separated from one another. The through holes 136 formed in the dielectric stack 130 may be arranged in array. In some embodiments, the through holes 136 formed in the dielectric stack 130 are classified into multiple columns of through holes, and the columns of through holes 136 are substantially aligned in the row direction. The through holes 136 are formed to accommodate subsequently formed source pillars (i.e. source electrodes), drain pillars (i.e. drain electrodes), isolation structures, channel layers and charge storage dielectric layers. In some embodiments, the through holes 136 are rectangular column spaces defined in the dielectric stack 130. The through holes 136 may be formed through a photolithography process followed by an etch process.

As illustrated in FIG. 2B, in some embodiments, sidewalls of the sacrificial dielectric layer 132A, the sacrificial dielectric layer 132B, the dielectric layer 134A and the dielectric layer 134B are vertical sidewalls, and the top dimension of the through holes 136A is substantially equal to the bottom dimension of the through holes 136A. In some alternative embodiments, not illustrated in figures, sidewalls of the sacrificial dielectric layer 132A, the sacrificial dielectric layer 132B, the dielectric layer 134A and the dielectric layer 134B are tapered sidewalls, and the top dimension of the through holes 136A is greater than the bottom dimension of the through holes 136A. In some embodiments, the width W1 of the through holes 136A ranges from about 30 nanometers to about 150 nanometers, and the length L1 of the through holes 136A ranges from about 30 nanometers to about 150 nanometers.

Figure 1C:
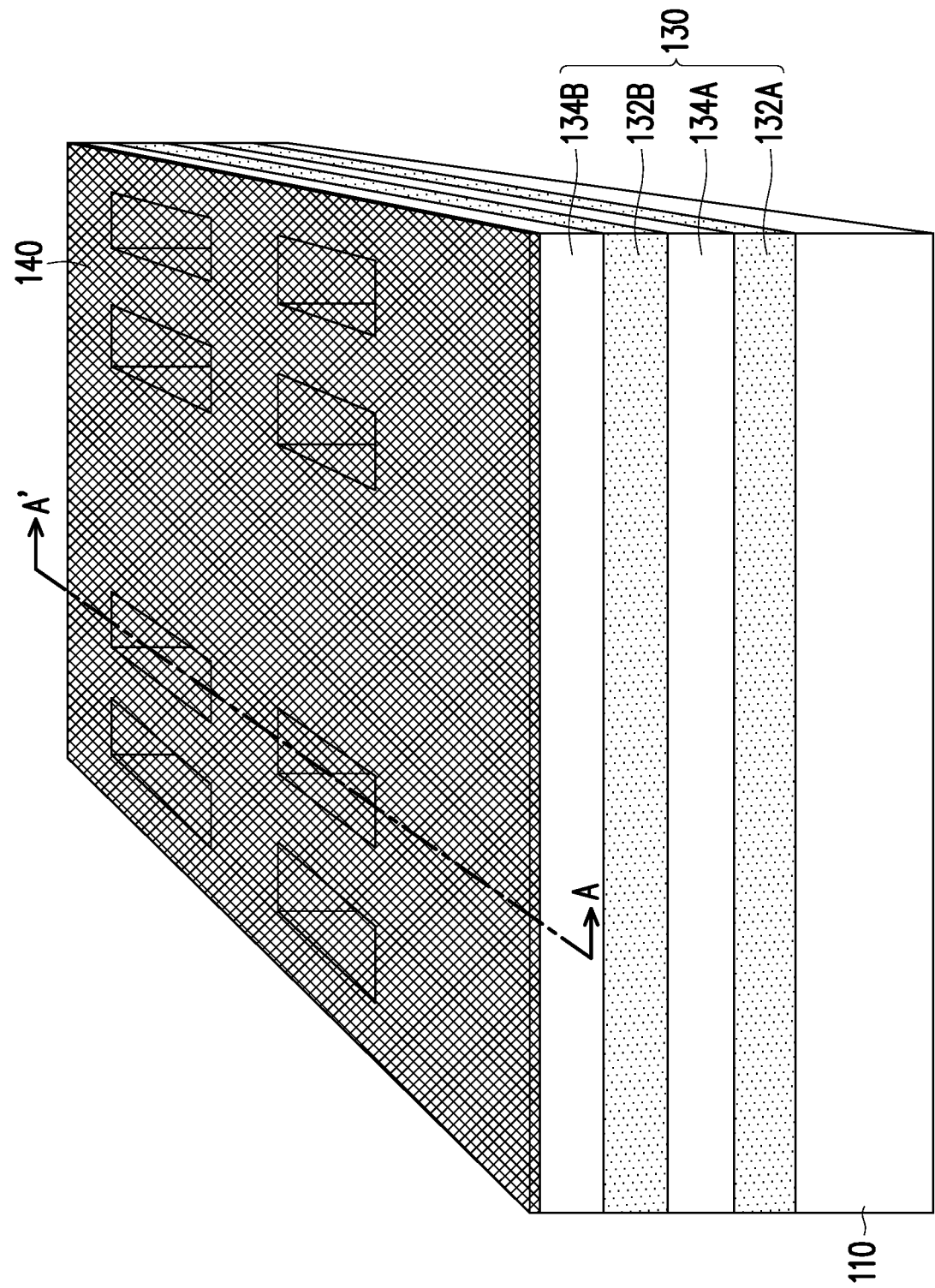
Figure 2C:
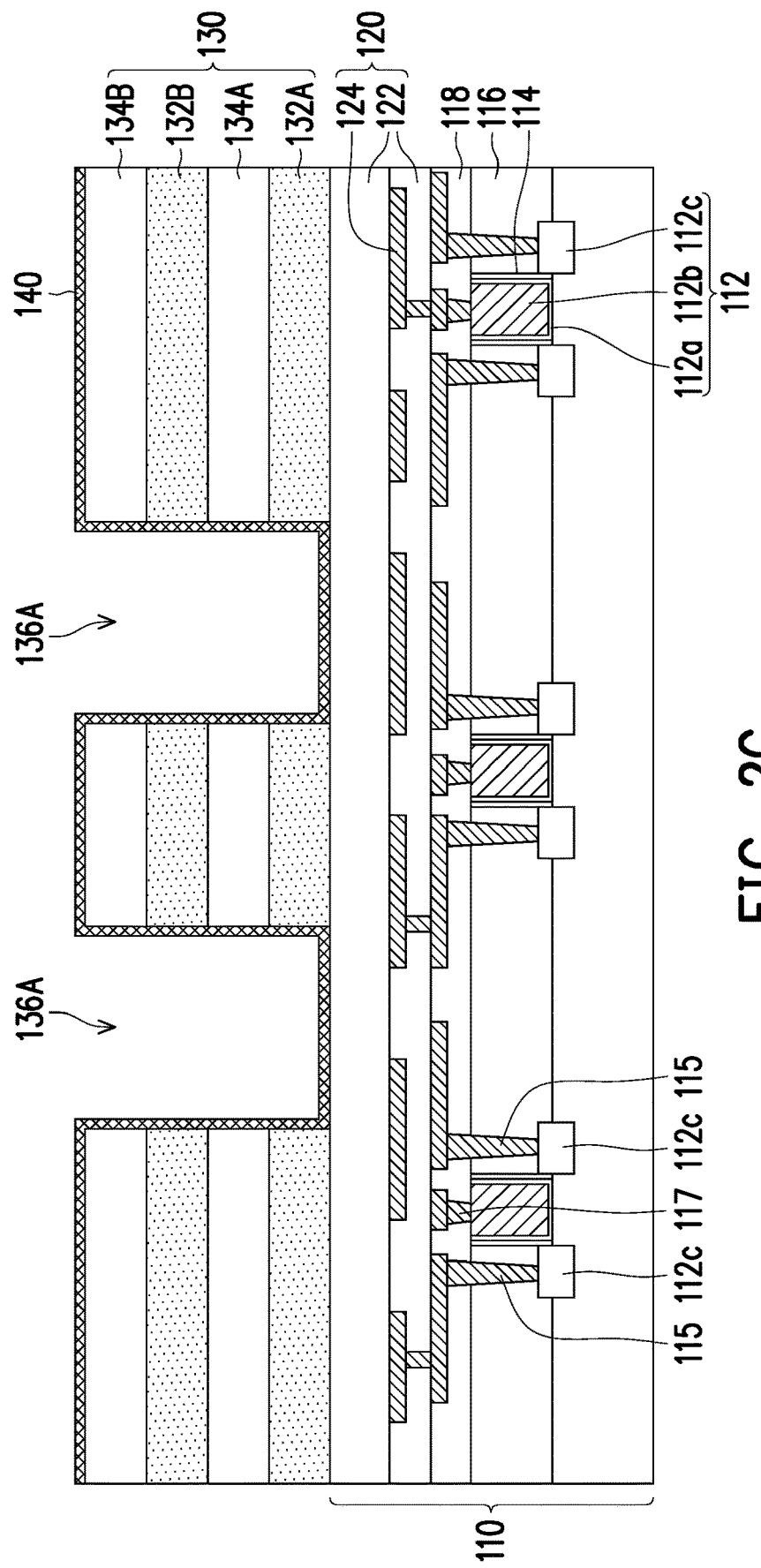

FIG. 2C is a cross-sectional view cutting along a cross-sectional line A-A' illustrated in FIG. 1C. Referring to FIG. 1C and FIG. 2C, a charge storage dielectric layer 140 may be deposited over the interconnect structure 120 of the substrate 110 and the dielectric stack 130. The charge storage dielectric layer 140 may be a ferroelectric layer conformally deposited in the through holes 136A along sidewalls the sacrificial dielectric layer 132A, the sacrificial dielectric layer 132B, the dielectric layer 134A and the dielectric layer 134B and along the top surface of the dielectric layer 134B. The ferroelectric layer may include materials that are capable of switching between two different polarization directions by applying an appropriate voltage differential across the ferroelectric layer. For example, the ferroelectric layer includes a high-k dielectric material, such as a hafnium (Hf) based dielectric materials or the like. In some alternative embodiments, the ferroelectric layer includes hafnium oxide, hafnium zirconium oxide, silicon-doped hafnium oxide, or the like.

In some other embodiments, the ferroelectric layer may include barium titanium oxide ($BaTiO_3$), lead titanium oxide ($PbTiO_3$), lead zirconium oxide ($PbZrO_3$), lithium niobium oxide ($LiNbO_3$), sodium niobium oxide ($NaNbO_3$), potassium niobium oxide ($KNbO_3$), potassium tantalum oxide ($KTaO_3$), bismuth scandium oxide ($BiScO_3$), bismuth iron oxide ($BiFeO_3$), hafnium erbium oxide ($H_{1-x}Y_xO$), hafnium lanthanum oxide ($Hf_{1-x}La_xO$), hafnium yttrium oxide ($H_{1-x}Ti_xO$), hafnium gadolinium oxide ($Hf_{1-x}Gd_xO$), hafnium aluminum oxide ($Hf_{1-x}Al_xO$), hafnium zirconium oxide ($Hf_{1-x}Zr_xO$, HZO), hafnium titanium oxide ($Hf_{1-x}Ti_xO$), hafnium tantalum oxide ($Hf_{1-x}Ta_O$), or the like. In some alternative embodiments, the charge storage dielectric layer 140 may include different ferroelectric materials or different types of memory materials. For example, the charge storage dielectric layer 140 may be a non-ferroelectric material, such as a multilayer memory structure including a layer of SiNX between two $SiO_x$ layers (e.g., an ONO structure). In some embodiments, the method of forming the charge storage dielectric layer 140 includes performing a suitable deposition technique, such as CVD, PECVD, metal oxide chemical vapor deposition (MOCVD), ALD, RPALD, PEALD, MBD or the like.

In some embodiments, the charge storage dielectric layer 140 has a thickness of about 1 nm to about 20 nm, such as 5 nm to 10 nm. Other thickness ranges (e.g., more than 20 nm or 5-15 nm) may be applicable. In some embodiments, the charge storage dielectric layer 140 is formed in a fully amorphous state. In some alternative embodiments, the charge storage dielectric layer 140 is formed in a partially crystalline state; that is, the charge storage dielectric layer 140 is formed in a mixed crystalline-amorphous state and having some degree of structural order. In yet alternative embodiments, the charge storage dielectric layer 140 is formed in a fully crystalline state. In some embodiments, the charge storage dielectric layer 140 is a single layer. In alternative embodiments, the charge storage dielectric layer 140 is a multi-layer structure.

Thereafter, an annealing process is performed to the charge storage dielectric layer 140 to achieve a desired crystalline lattice structure for the charge storage dielectric layer 140. In some embodiments, upon the annealing process, the charge storage dielectric layer 140 is transformed from an amorphous state to a partially or fully crystalline sate. In alternative embodiments, upon the annealing process, the charge storage dielectric layer 140 is transformed from a partially crystalline state to a fully crystalline sate.

Figure 1D:
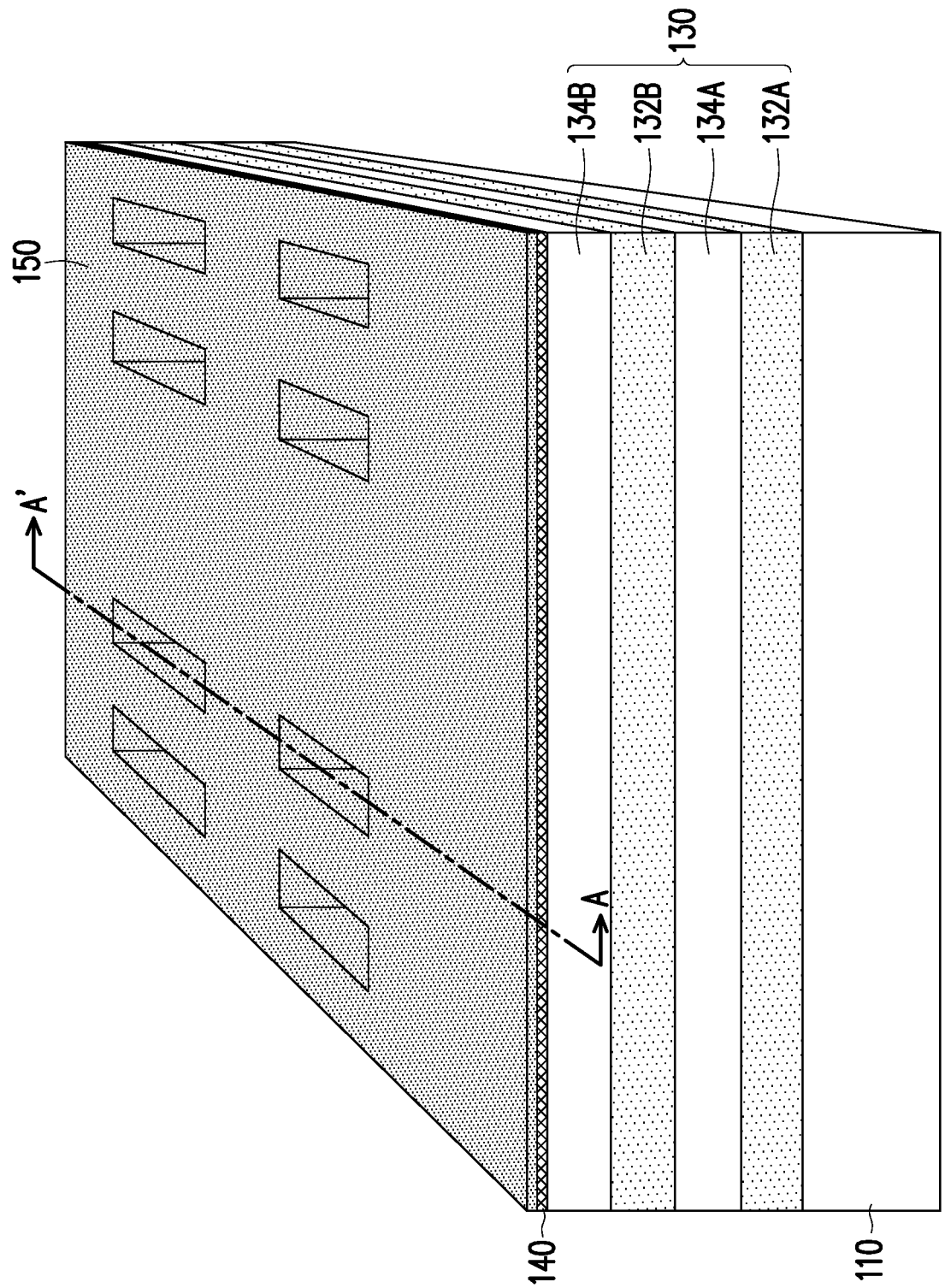
Figure 2D:
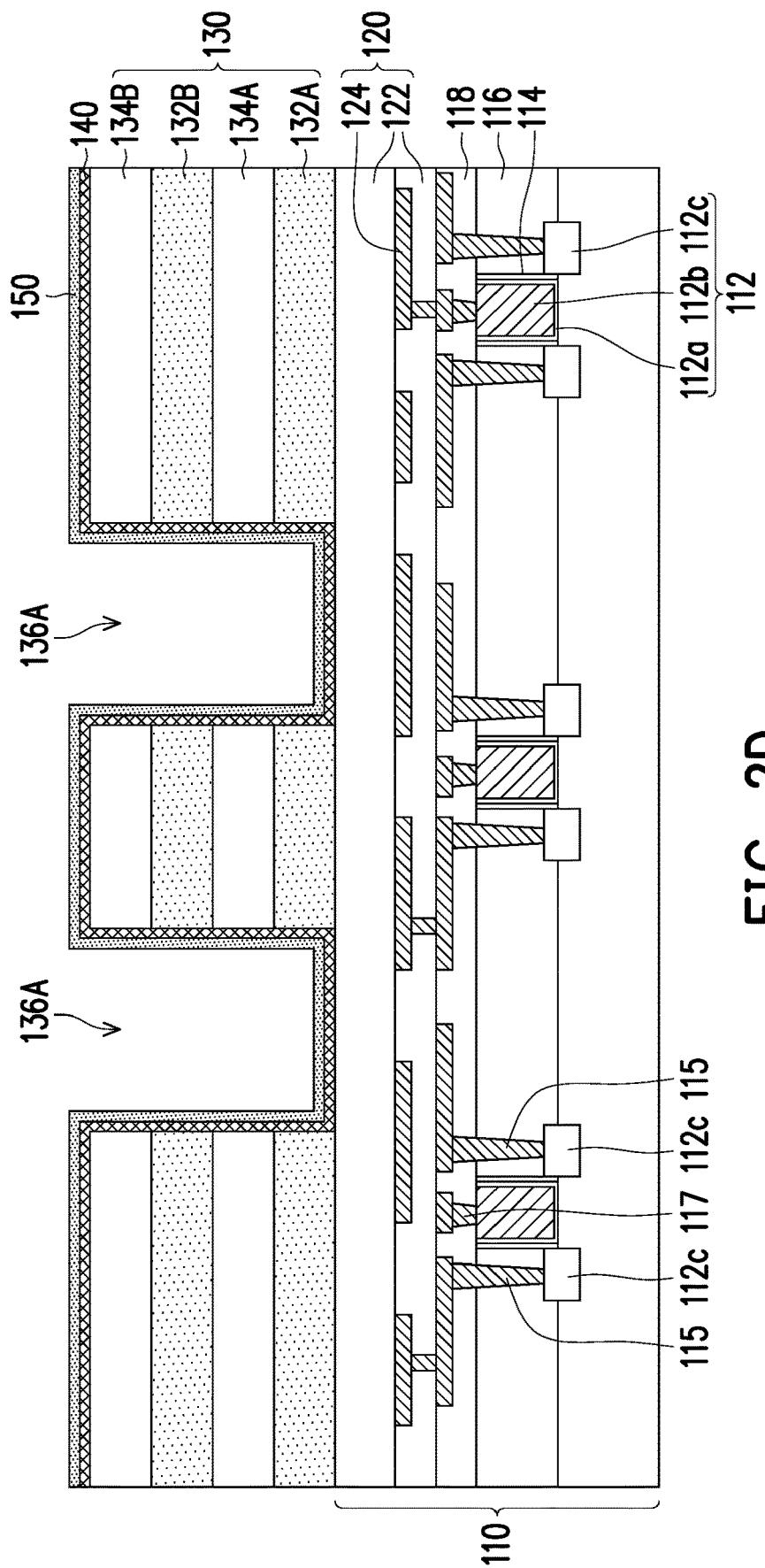

FIG. 2D is a cross-sectional view cutting along a cross-sectional line A-A' illustrated in FIG. 1D. Referring to FIG. 1D and FIG. 2D, a channel layer 150 is conformally deposited in the through holes 136A over the charge storage dielectric layer 140. The channel layer 150 includes materials suitable for providing channel portions for the memory cells. For example, the channel layer 150 includes oxide semiconductor (OS) such as zinc oxide (ZnO), indium tungsten oxide (InWO), indium gallium zinc oxide (InGaZnO, IGZO), indium zinc oxide (InZnO), indium tin oxide (ITO), combinations thereof, or the like. In some embodiments, channel layer 150 includes polycrystalline silicon (poly-Si), amorphous silicon (a-Si), or the like. The channel layer 150 may be deposited by CVD, PVD, ALD, PECVD, or the like. The channel layer 150 may extend along sidewalls the sacrificial dielectric layer 132A, the sacrificial dielectric layer 132B, the dielectric layer 134A and the dielectric layer 134B and along the top surface of the dielectric layer 134B. After the channel layer 150 is deposited, an annealing process may be performed to activate the charge carriers of the channel layer 150.

Figure 1E:
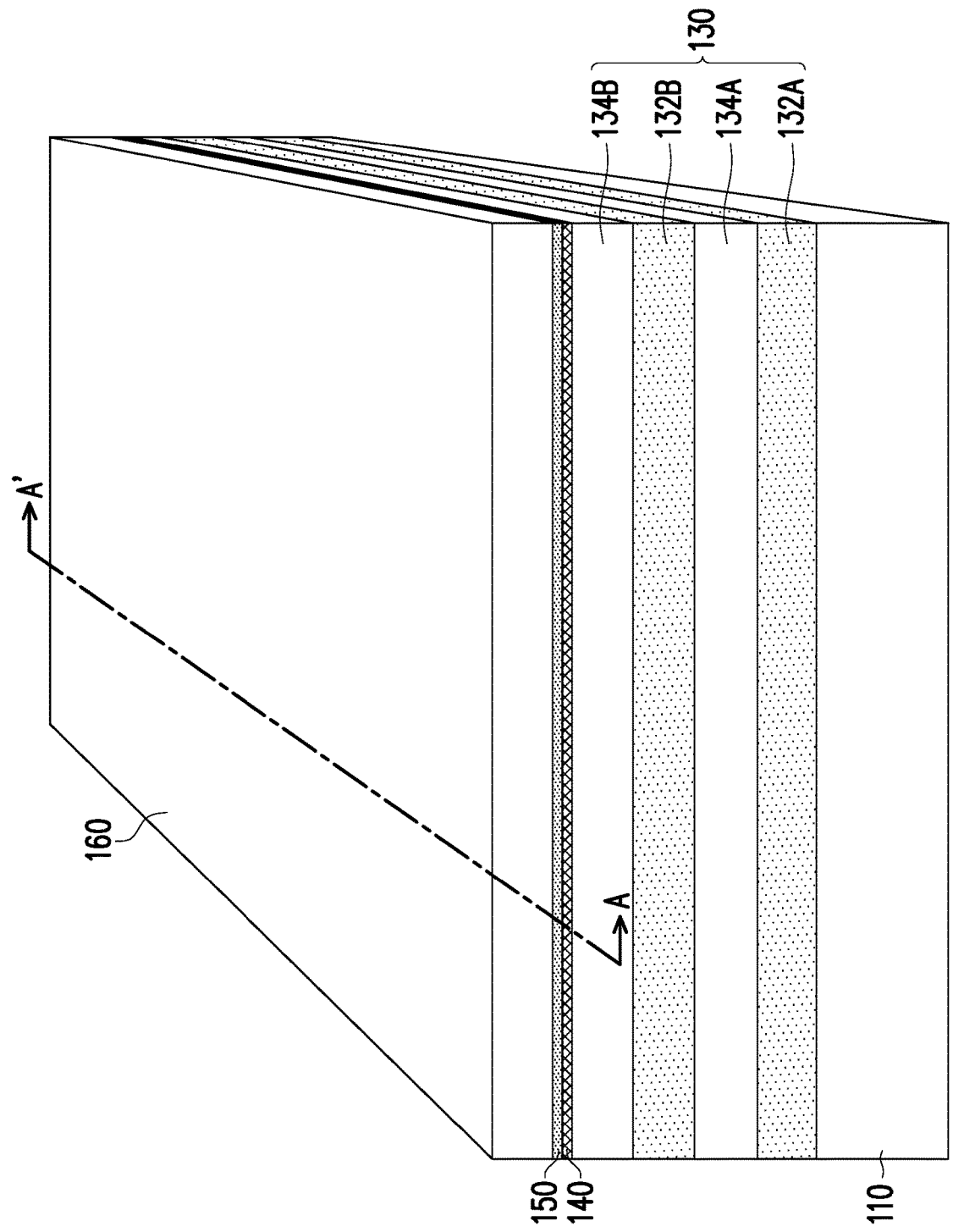
Figure 2E:
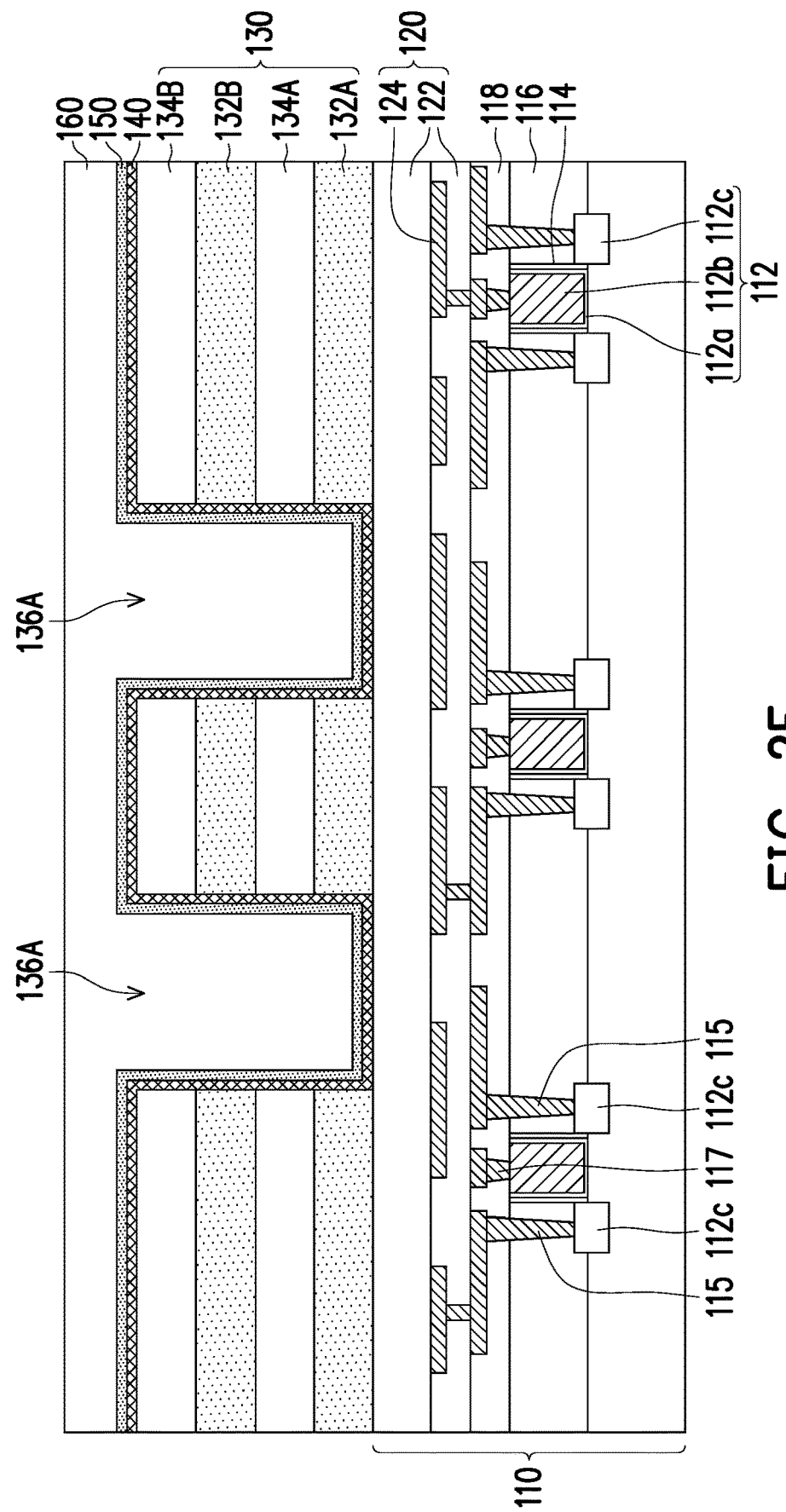

FIG. 2E is a cross-sectional view cutting along a cross-sectional line A-A' illustrated in FIG. 1AE. Referring to FIG. 1E and FIG. 2E, an insulating material 160 is deposited in the through holes 136A over the channel layer 150. The insulating material 160 is deposited to completely fill the through holes 136A. In some embodiments, the insulating material 160 includes silicon oxide, silicon nitride, silicon oxynitride, or the like, which may be deposited by CVD, PVD, ALD, PECVD, or the like. The insulating material 160 may have a substantial planar top surface.

Figure 1F:
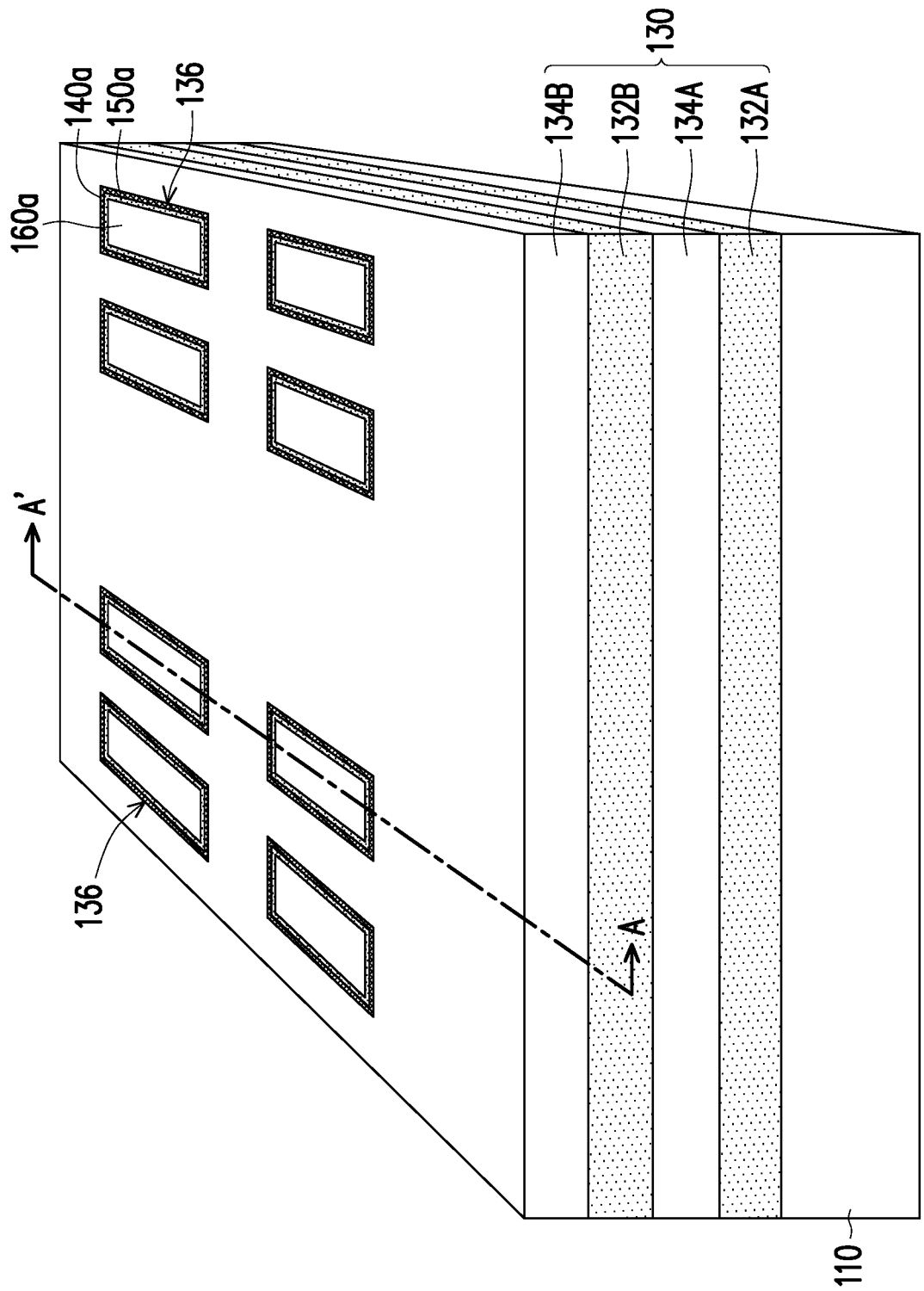
Figure 2F:
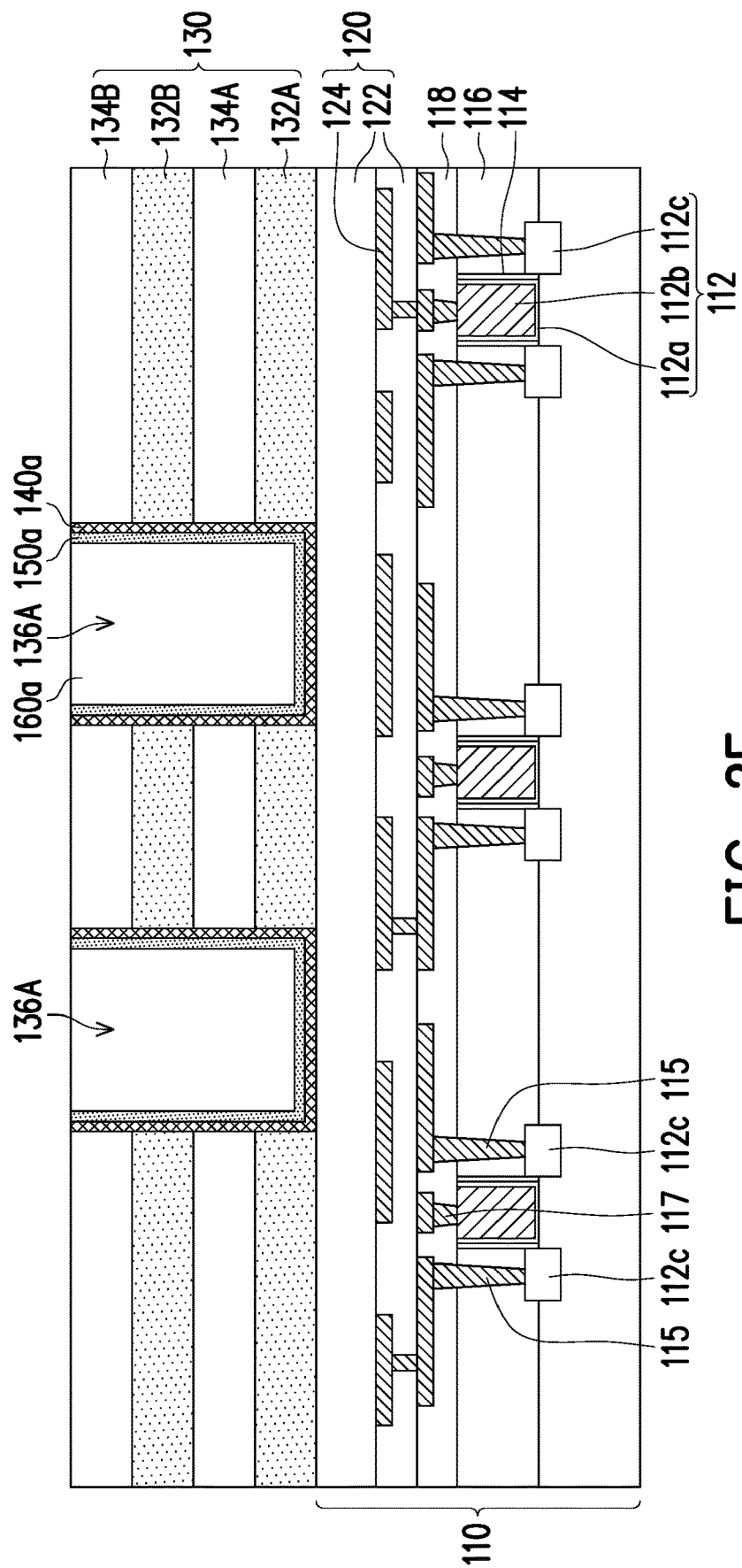

FIG. 2F is a cross-sectional view cutting along a cross-sectional line A-A' illustrated in FIG. 1F. Referring to FIG. 1E, FIG. 1F, FIG. 2E and FIG. 2F, a removal process is performed to the insulating material 160, the channel layer 150 and the charge storage dielectric layer 140 to remove excess materials over the dielectric stack 130 such that charge storage dielectric layers 140a, channel layers 150a and isolation structures 160a are formed in the through holes 136A. In some embodiments, a planarization process such as a CMP, an etch-back process, combinations thereof, or the like may be utilized to remove excess materials over the dielectric stack 130. The planarization process exposes the dielectric stack 130 such that the top surface of the dielectric stack 130 (e.g., the dielectric layer 134B), top surfaces of the charge storage dielectric layers 140a, top surfaces of the channel layers 150a and top surfaces of the isolation structures 160a are level after the planarization process is complete.

Figure 1G:
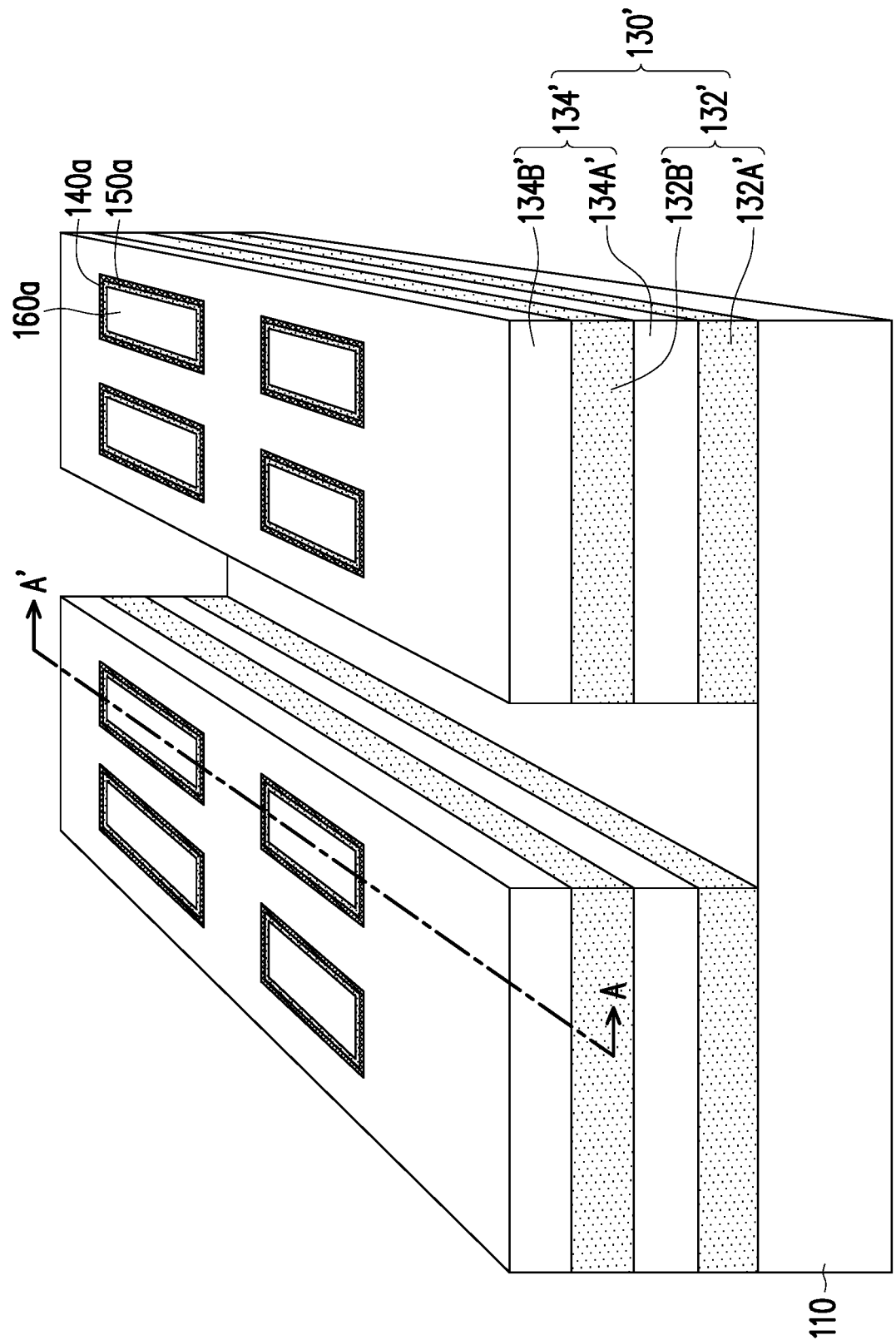

Referring to FIG. 1F and FIG. 1G, the dielectric stack 130 is further patterned to form multiple strip-shaped stacking structures 130', wherein each of the strip-shaped stacking structures 130' includes sacrificial dielectric patterns 132A' and 132B' (collectively referred to as sacrificial dielectric patterns 132') and dielectric patterns 134A' and 134B' (collectively referred to as dielectric patterns 134') stacked alternately. The patterning process of the dielectric stack 130 may be formed through a photolithography process followed by an etch process. As illustrated in FIG. 1G, after the dielectric stack 130 is patterned to form the strip-shaped stacking structures 130', each of the strip-shaped stacking structures 130' may have a group of through holes 136A for accommodating respective charge storage dielectric layers 140a, channel layers 150a and isolation structures 160a. Although FIG. 1G illustrates four through holes 136A for accommodating respective charge storage dielectric layers 140a, channel layers 150a and isolation structures 160a are included in each of the strip-shaped stacking structures 130', other embodiments may include different numbers of through holes 136A in each strip-shaped stacking structure 130'.

Figure 1H:
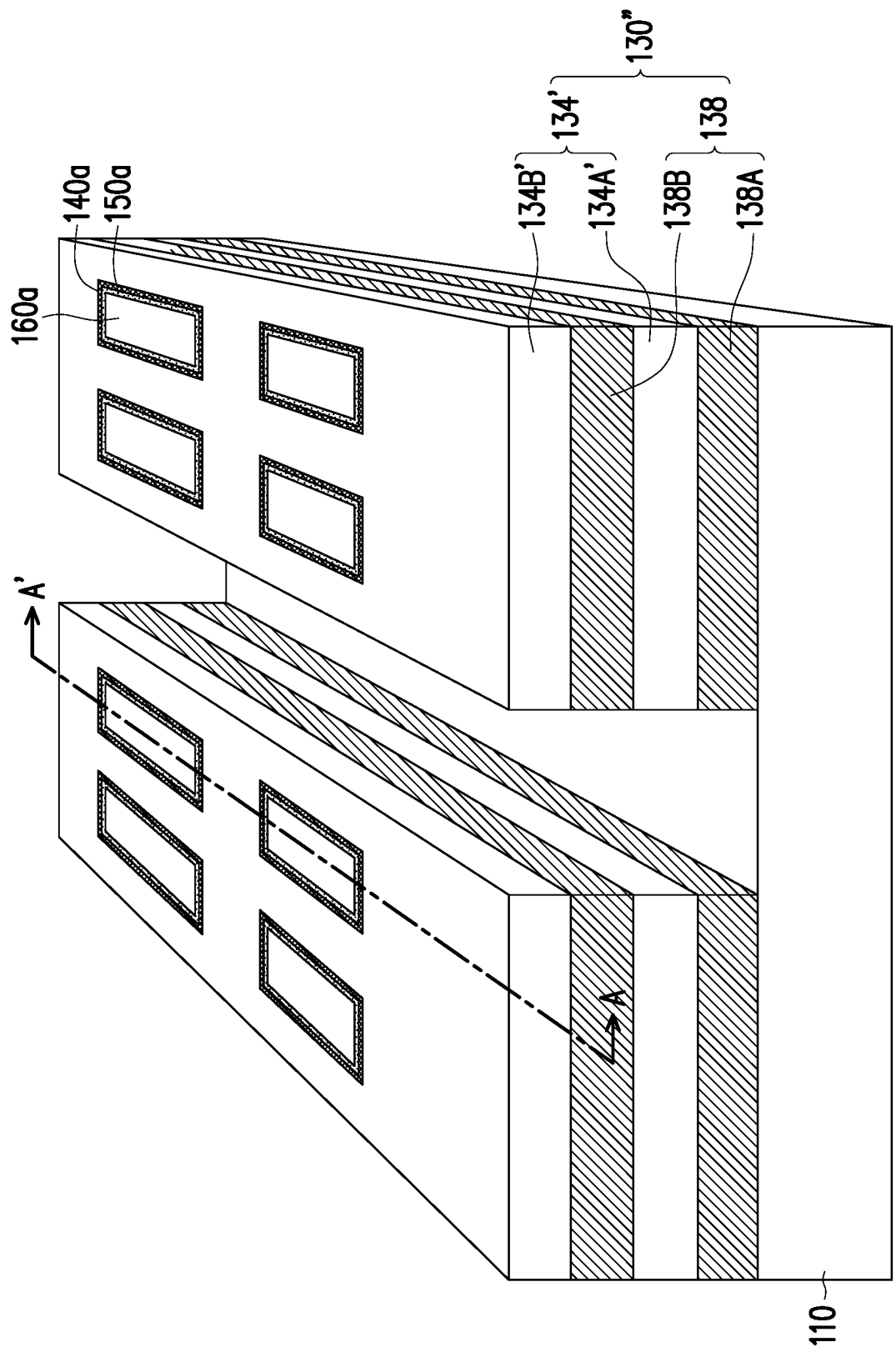
Figure 11:
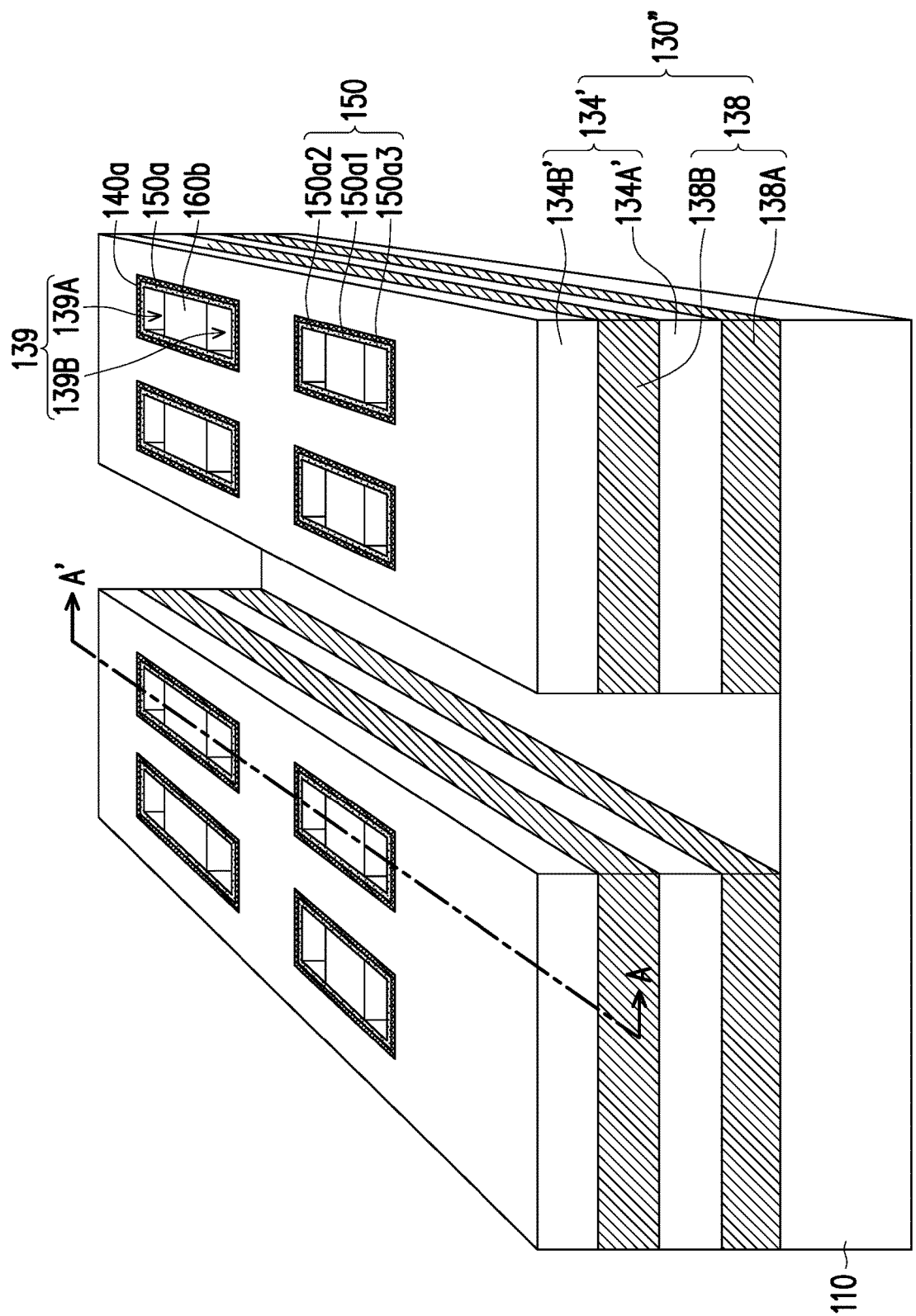
Figure 2G:
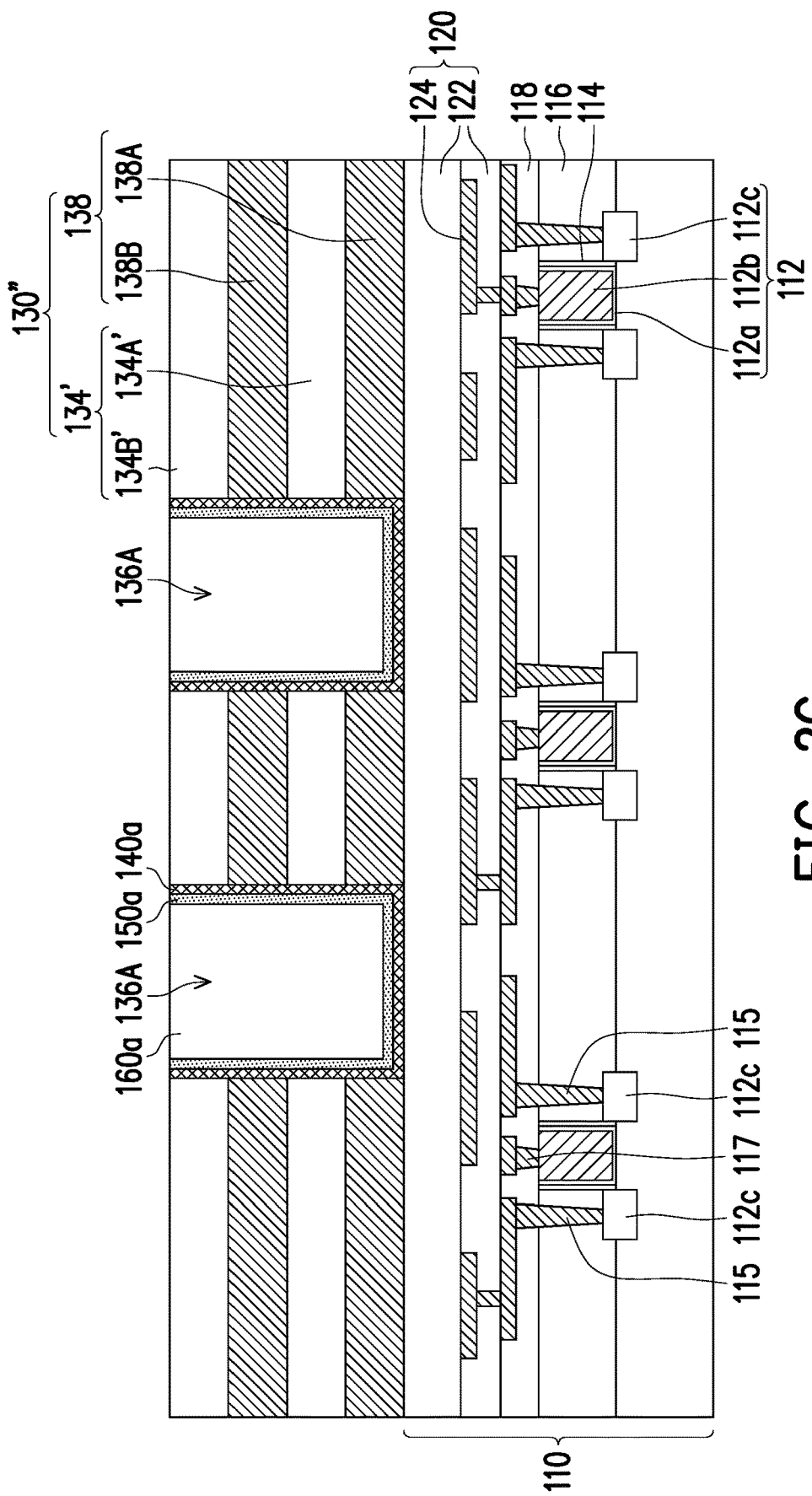

FIG. 2G is a cross-sectional view cutting along a cross-sectional line A-A' illustrated in FIG. 1H. Referring to FIG. 1G, FIG. 1H and FIG. 2G, in some embodiments, upon a replacement process, the sacrificial dielectric patterns 132' of the strip-shaped stack structures 130' are subsequently replaced with conductive lines 138 such that multiple strip-shaped stacking structures 130'', wherein each of the strip-shaped stacking structures 130'' includes conductive lines 138A and 138B (collectively referred to as conductive lines 138) and dielectric patterns 134A' and 134B' (collectively referred to as dielectric patterns 134') stacked alternately. The strip-shaped stacking structures 130'' may be paralleled to one another. The sacrificial dielectric patterns 132A' and 132B' are removed and replaced with conductive materials to define the conductive lines 138A and 138B. The conductive lines 138A and 138B may correspond to word lines in the ferroelectric memory device, and the conductive lines 138A and 138B may further serve as gate electrodes for the resulting memory cells of the ferroelectric memory device. In some embodiments, the sacrificial dielectric patterns 132A' and 132B' are removed by an acceptable process, such as a wet etching process, a dry etching process or both. Thereafter, the conductive lines 138A are filled into the spaces between the dielectric patterns 134A' and the substrate 110, and the conductive lines 138B are filled into the spaces between the dielectric patterns 134A' and the dielectric patterns 134B'. The conductive lines 138A and 138B may be formed by a deposition process followed by an etch process.

Figure 2H:
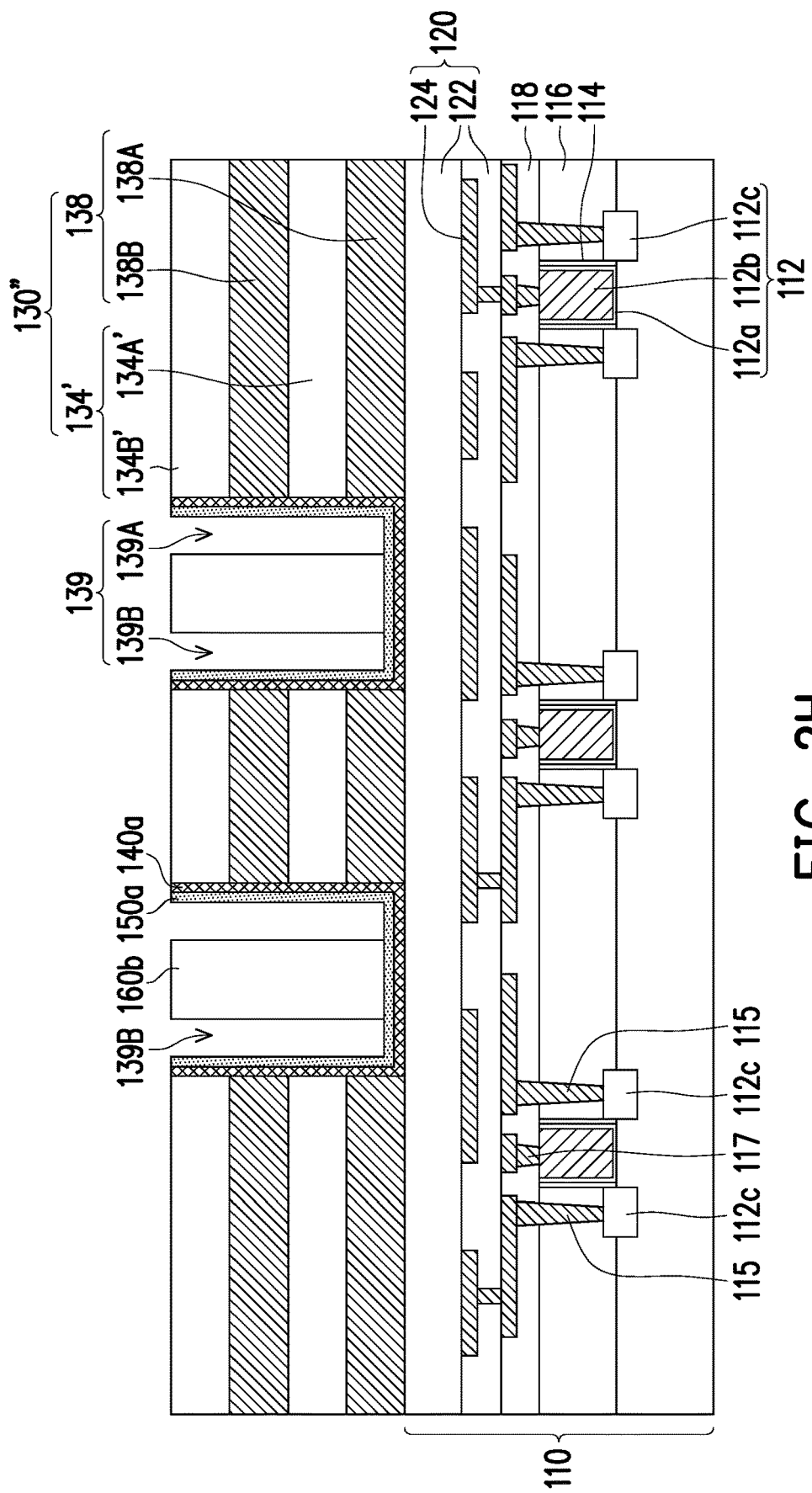

FIG. 2H is a cross-sectional view cutting along a cross-sectional line A-A' illustrated in FIG. 1I. Referring to FIG. 1H, FIG. 1I, FIG. 2G and FIG. 2H, pairs of pillar-shaped apertures 139A and 139B (collectively referred to as pillar-shaped apertures 139) are formed through the isolation structures 160a by a patterning process such that isolation structures 160b (e.g., isolation pillars) are formed between respective pairs of pillar-shaped apertures 139A and 139B. After forming the pillar-shaped apertures 139 and the isolation structure 160b, portions of the channel layers 150a are revealed. Each pair of the pillar-shaped apertures 139A and 139B are spaced apart from each other by a respective isolation structure 160b. The patterning process of the isolation structures 160a may be or include a photolithography process followed by an etch process.

As illustrated in FIG. 1I, each of the channel layers 150a may include two channel portions 150a1, a first contact portion 150a2 and a second contact portion 150a3. The first contact portion 150a2 and the second contact portion 150a3 may be in contact with the subsequently formed source/drain pillars. The channel portions 150a1 are in contact with the isolation structures 160b. In each channel layer 150a, the channel portions 150a1 are connected between the first contact portion 150a2 and the second contact portion 150a3. The first contact portions 150a2 and the second contact portions 150a3 of the channel layers 150a are not in directly contact with the isolation structures 160b. The first contact portions 150a2 and the second contact portions 150a3 of the channel layers 150a are revealed by the pairs of pillar-shaped apertures 139A and 139B respectively.

Figure 1J:
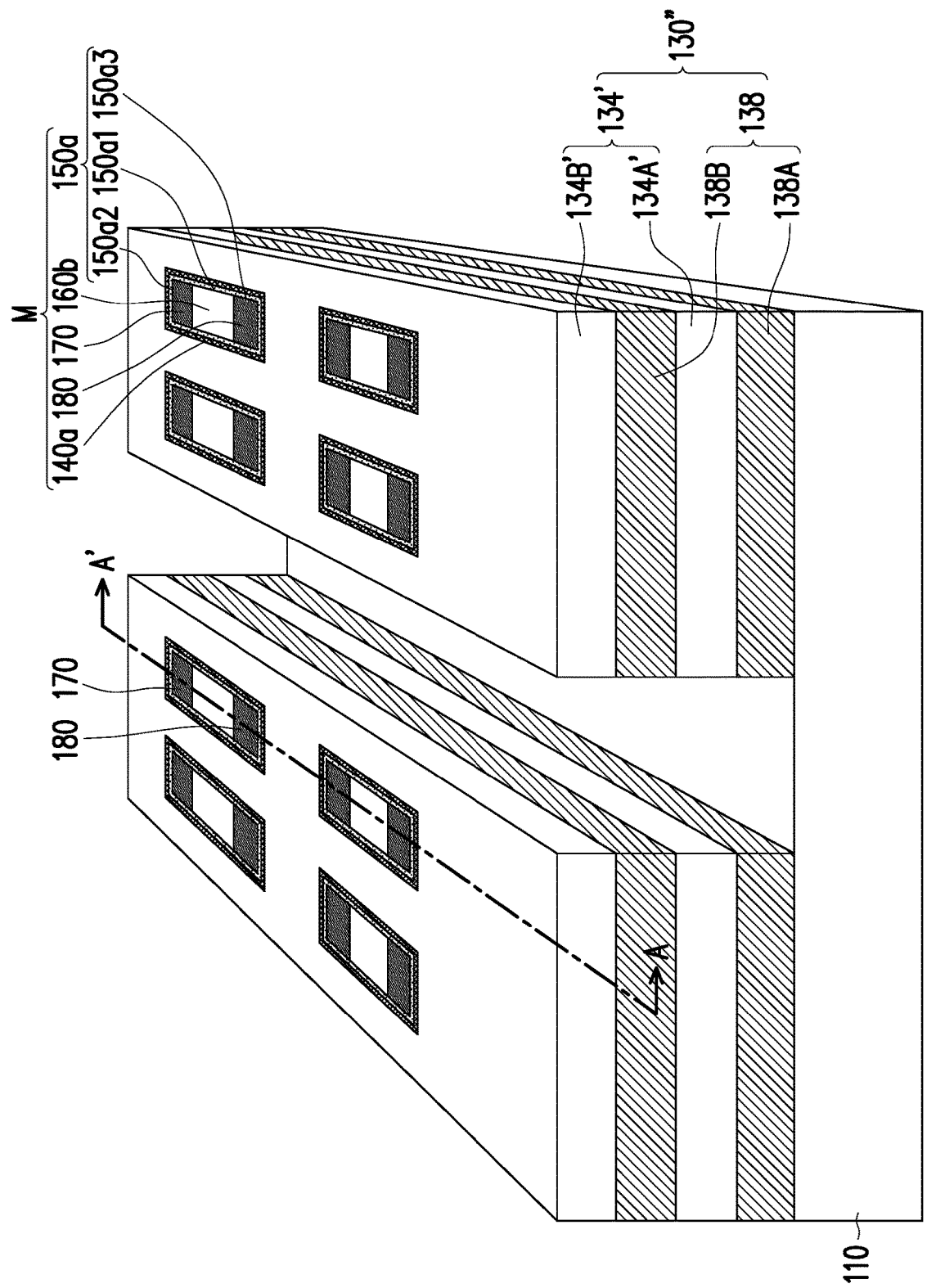
Figure 2I:
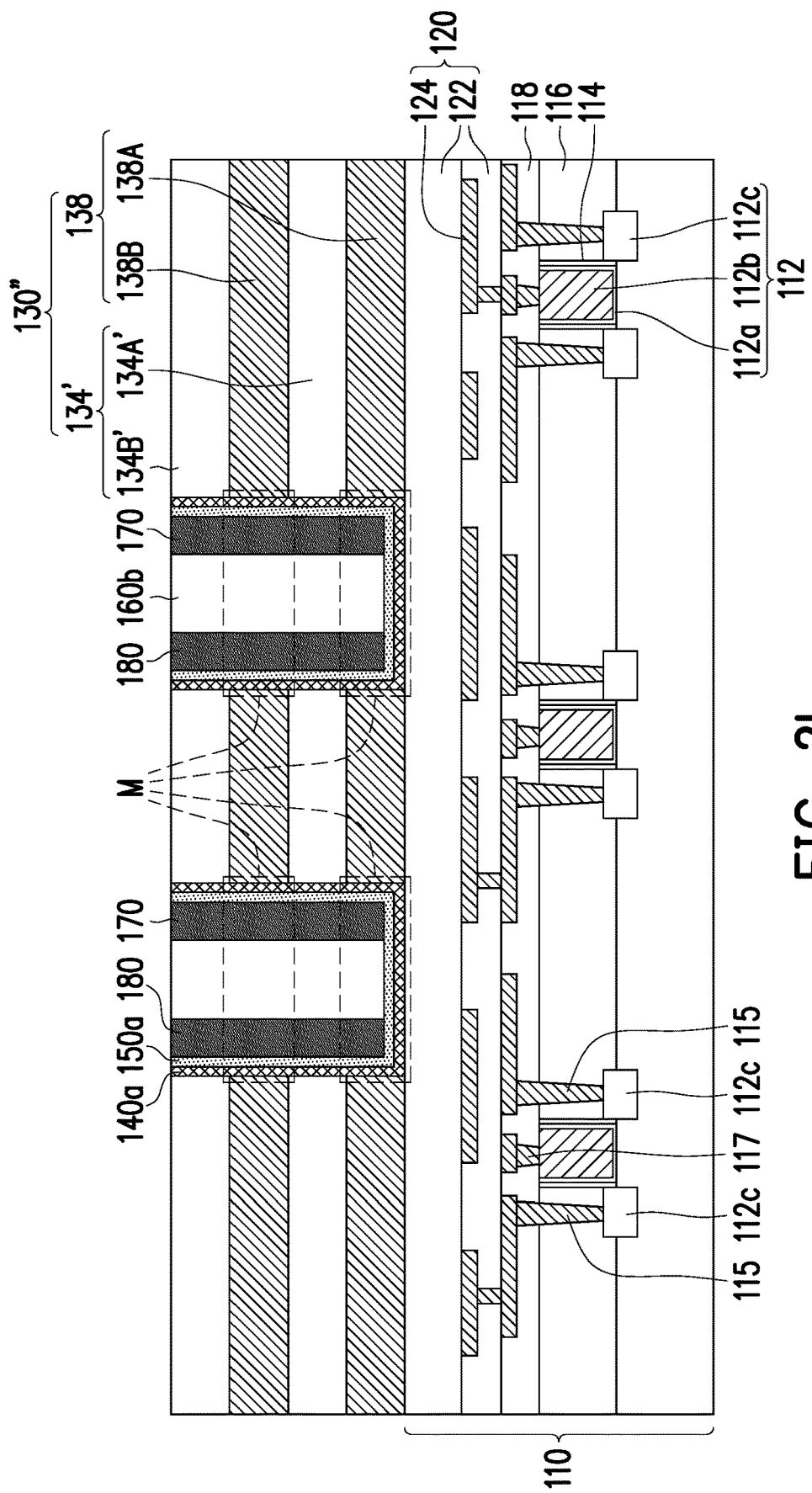

FIG. 2I is a cross-sectional view cutting along a cross-sectional line A-A' illustrated in FIG. 1J. Referring to FIG. 1J and FIG. 2I, the pillar-shaped apertures 139 shown in FIG. 1I and FIG. 2H are filled with a conductive material to form the conductive pillars 170 and the conductive pillars 180. The conductive material may include copper, titanium, titanium nitride, tantalum, tantalum nitride, tungsten, ruthenium, aluminum, combinations thereof, or the like, which may be formed using, for example, CVD, ALD, PVD, PECVD, or the like. After the conductive material is deposited, a planarization (e.g., a CMP, etch back, or the like) may be performed to remove excess portions of the conductive material, thereby forming the conductive pillars 170 and the conductive pillars 180. In the resulting structure, top surfaces of the strip-shaped stacking structures 130'' (e.g., the dielectric patterns 134B'), top surfaces of the charge storage dielectric layers 140a, top surfaces of the channel layers 150a, top surfaces of the isolation structure 160b, top surfaces of the conductive pillars 170, and top surfaces of the conductive pillars 180 may be substantially level (e.g., within process variations). In some embodiments, the conductive pillars 170 serve as source pillars (i.e. source electrode), and the conductive pillars 180 serve as drain pillars (i.e. drain electrode).

After forming the conductive pillars 170 and the conductive pillars 180, multiple pillar-shaped structures penetrating through the conductive lines 138 and the dielectric patterns 134' of a strip-shaped stacking structure 130'' are formed. Each of the pillar-shaped structures includes a conductive pillar 170, a conductive pillar 180, an isolation structure 160b disposed between the conductive pillar 170 and the conductive pillar 180, a channel layer (e.g., an oxide semiconductor layer) 150a, and a charge storage dielectric layer 140a. The channel layer 150a and the charge storage dielectric layer 140a laterally surround the conductive pillar 170, the conductive pillar 180 and the isolation structure 160b. The charge storage dielectric layer 140a is disposed between the channel layer 150a and a corresponding strip-shaped stacking structure 130''.

The channel layers 150a are spaced apart from the conductive lines 138 (e.g., word lines) by the charge storage dielectric layers 140a. In some embodiments, the source pillars 170 are spaced apart from the charge storage dielectric layers 140a by the first contact portions 150a2 of the channel layers 150a, and the drain pillars 180 are spaced apart from the charge storage dielectric layers 140a by the second contact portions 150a3 of the channel layers 150a. In some embodiments, the isolation structures 160b are spaced apart from the charge storage dielectric layers 140a by channel portions 150a1 of the channel layers 150a.

In some embodiments, the channel layers 150a are in contact with sidewalls of the source pillars 170, sidewalls of the drain pillars 180 and sidewalls of the isolation structures 160b. In some embodiments, inner sidewalls of the charge storage dielectric layers 140a are in contact with the channel layers 150a, and outer sidewalls of the charge storage dielectric layers 140a are in contact with the conductive lines 138 (e.g., word lines).

After forming the conductive pillars 170 and the conductive pillars 180, stacked memory cells M are formed in the strip-shaped stacking structures 130". Each memory cell M includes a gate electrode (e.g., a portion of a corresponding conductive line 138), a gate dielectric (e.g., a corresponding charge storage dielectric layer 140a), channel regions (e.g., channel portions 150a1 of a corresponding channel layer 150a), a source pillar (e.g., a corresponding conductive pillar 170), and a drain pillars (e.g., a corresponding conductive pillar 180). The isolation structures 160b isolate the source pillar 170 and the drain pillar 180 of each memory cell M. The source pillar 170 and the drain pillar 180 are spaced apart by the isolation structure 160b. Further, the memory cells M may be disposed in an array of vertically stacked rows and columns.

In some embodiments, the stacked memory cells M may be classified into multiple tiers of memory cells. First portions of the stacked memory cells M which are embedded in and surrounded by the conductive lines 138A may be considered as a lower tier of memory cells, and second portions of the stacked memory cells M which are embedded in and surrounded by the conductive lines 138B may be considered as an upper tier of memory cells.

In some other embodiments, the stacked memory cells M may be classified into multiple groups of memory cells. Each group of memory cells M are embedded in and surrounded by one of the conductive lines 138A or one of the conductive lines 138B. Each group of memory cells may share the conductive line 138A or 138B. As illustrated in FIG. 1J, no memory cell is formed in gaps or trenches between the strip-shaped stacking structures 130". Furthermore, the memory cells M formed in the strip-shaped stacking structures 130" are classified into multiple columns of memory cells M, and the columns of memory cells M are substantially aligned in the row direction.

Figure 1K:
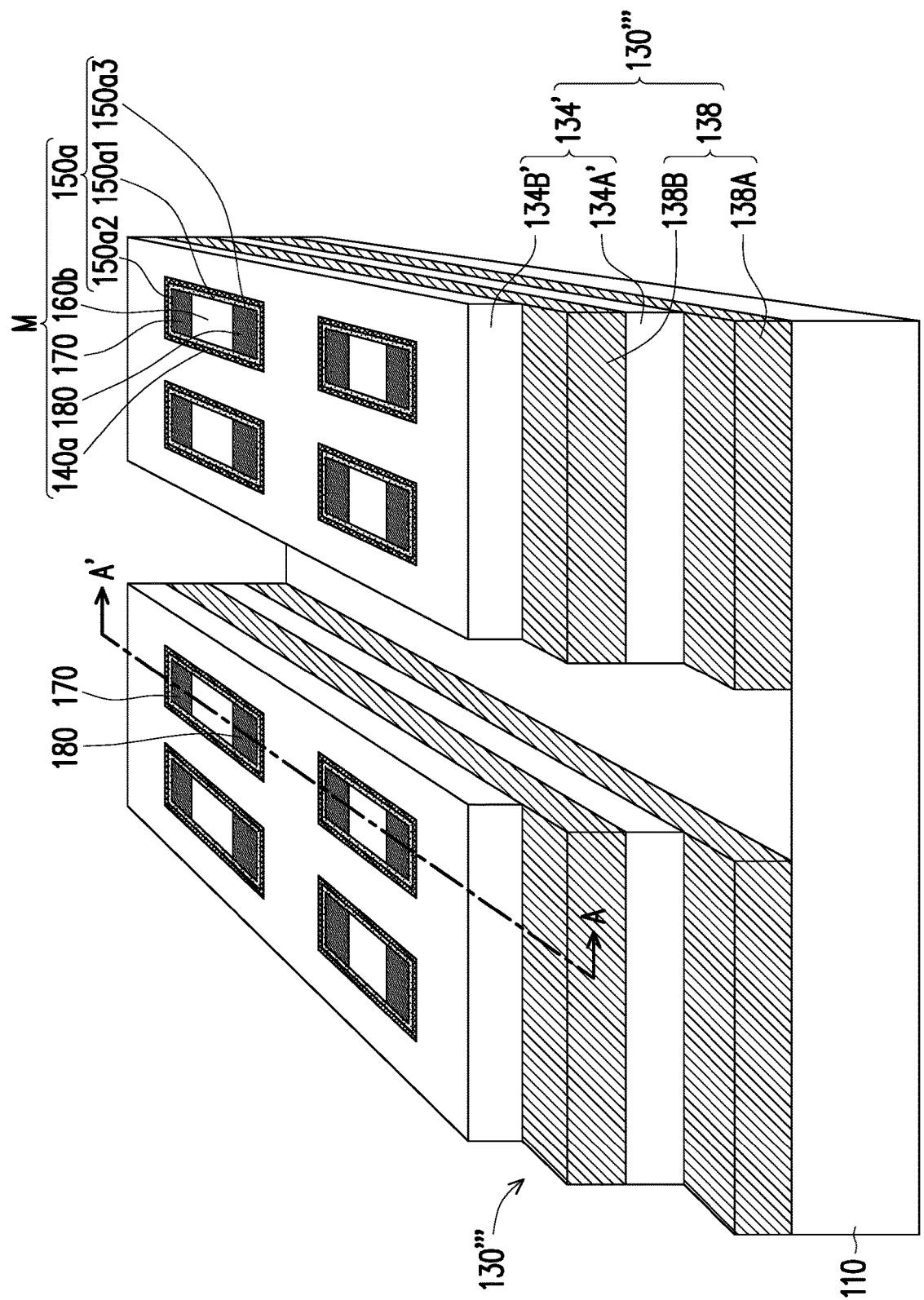
Figure 2J:
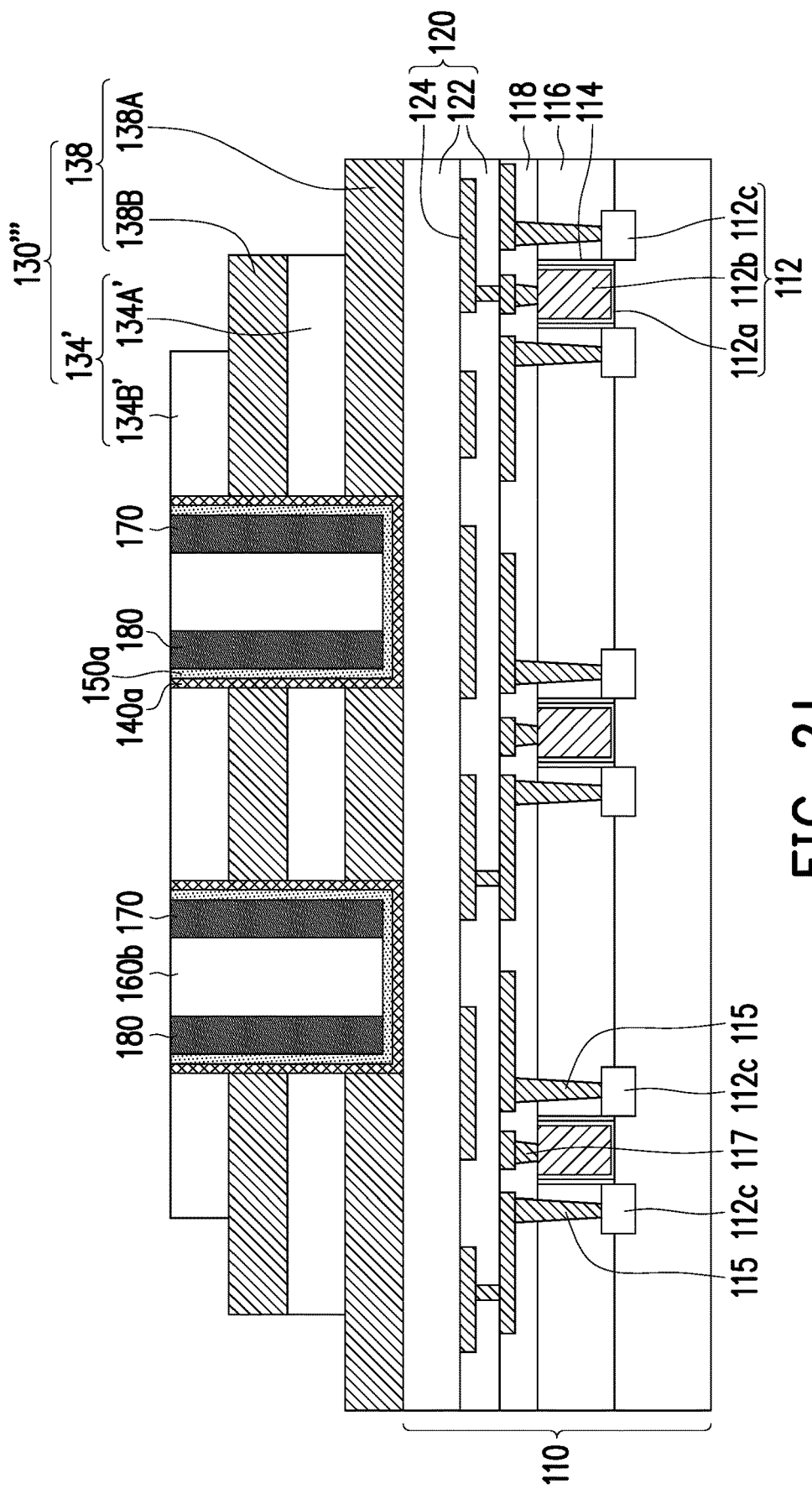

FIG. 2J is a cross-sectional view cutting along a cross-sectional line A-A' illustrated in FIG. 1K. Referring to FIG. 1K and FIG. 2J, a series of patterning processes of the strip-shaped stacking structures 130" are performed such that strip-shaped stacking structures 130'" having staircase configuration can be formed. In some embodiments, in each of the strip-shaped stacking structures 130'", the lower tier conductive lines 138A in the staircase configuration are longer than and extend laterally past endpoints of upper tier conductive lines 138B in the staircase configuration. The series of patterning processes of the strip-shaped stacking structures 130" may include: (a) forming a photoresist over the strip-shaped stacking structures 130"; (b) patterning the photoresist formed over the strip-shaped stacking structures 130"; (c) removing portions of the dielectric patterns 134B' and portions of the conductive lines 138B which are uncovered by the photoresist until the dielectric patterns 134A' are revealed; (d) performing a trimming process for reducing the width of the photoresist; (e) after performing the trimming process, removing (e.g., etching) portions of the dielectric patterns 134A' and portions of the conductive lines 138A which are uncovered by the photoresist having reduced width; and (f) removing the photoresist having reduced width. Although FIG. 1K and FIG. 2J illustrate that two layers of dielectric patterns and two layers of conductive lines are etched to form staircase configurations, any number of etching and trimming processes may be used. The above-mentioned patterning processes of the strip-shaped stacking structures 130" are performed after the formation of the memory cells M, and the above-mentioned patterning processes of the strip-shaped stacking structures 130" are so-call "staircase last" processes.

In some alternative embodiments, a series of patterning processes are performed before the formation of the memory cells M. The patterning processes illustrated in FIG. 2J may be performed on the dielectric stack 130 (shown in FIG. 1A), and the patterning processes of the dielectric stack 130 are so-call "staircase first" processes.

Figure 1L:
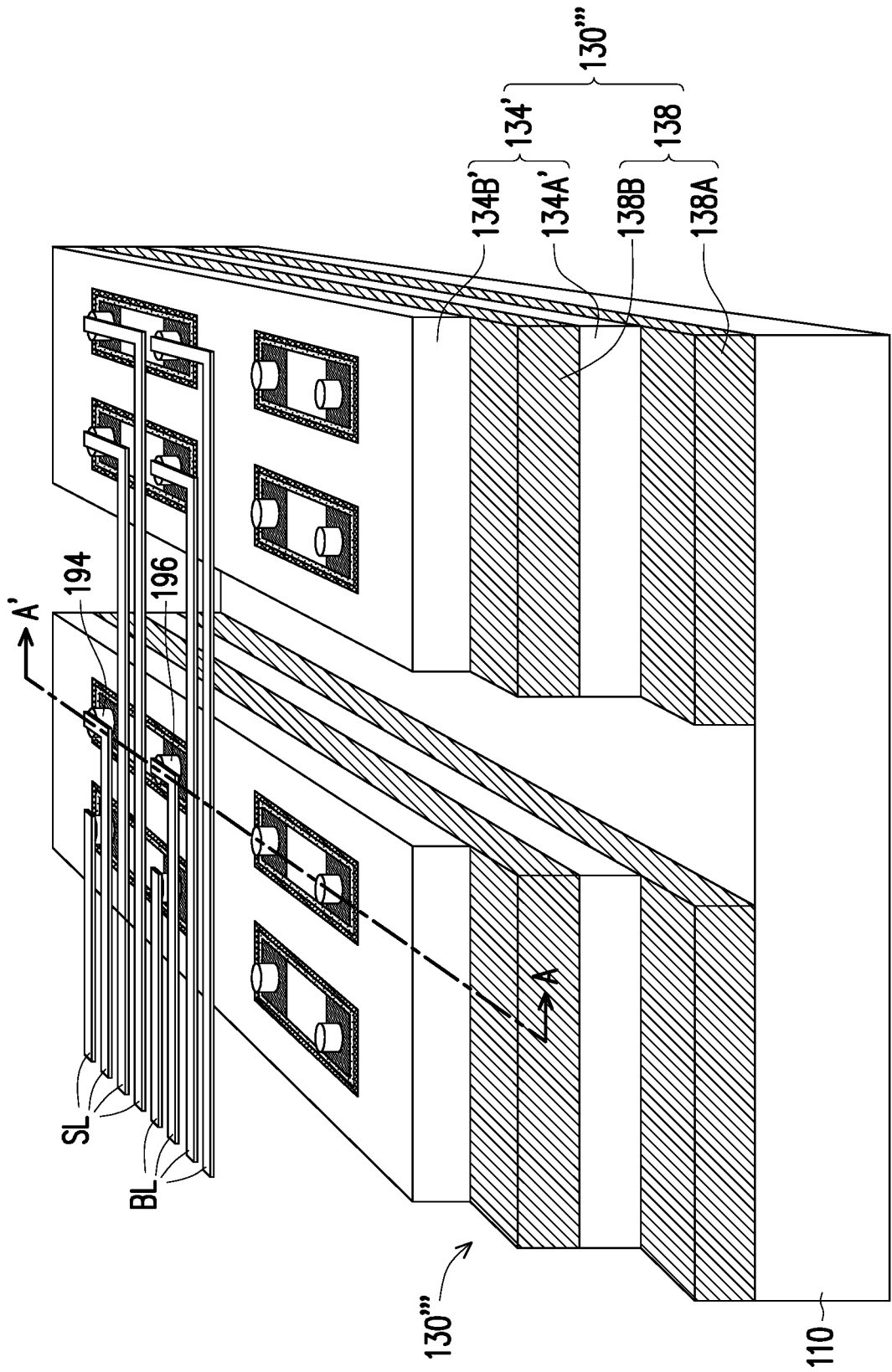
Figure 2K:
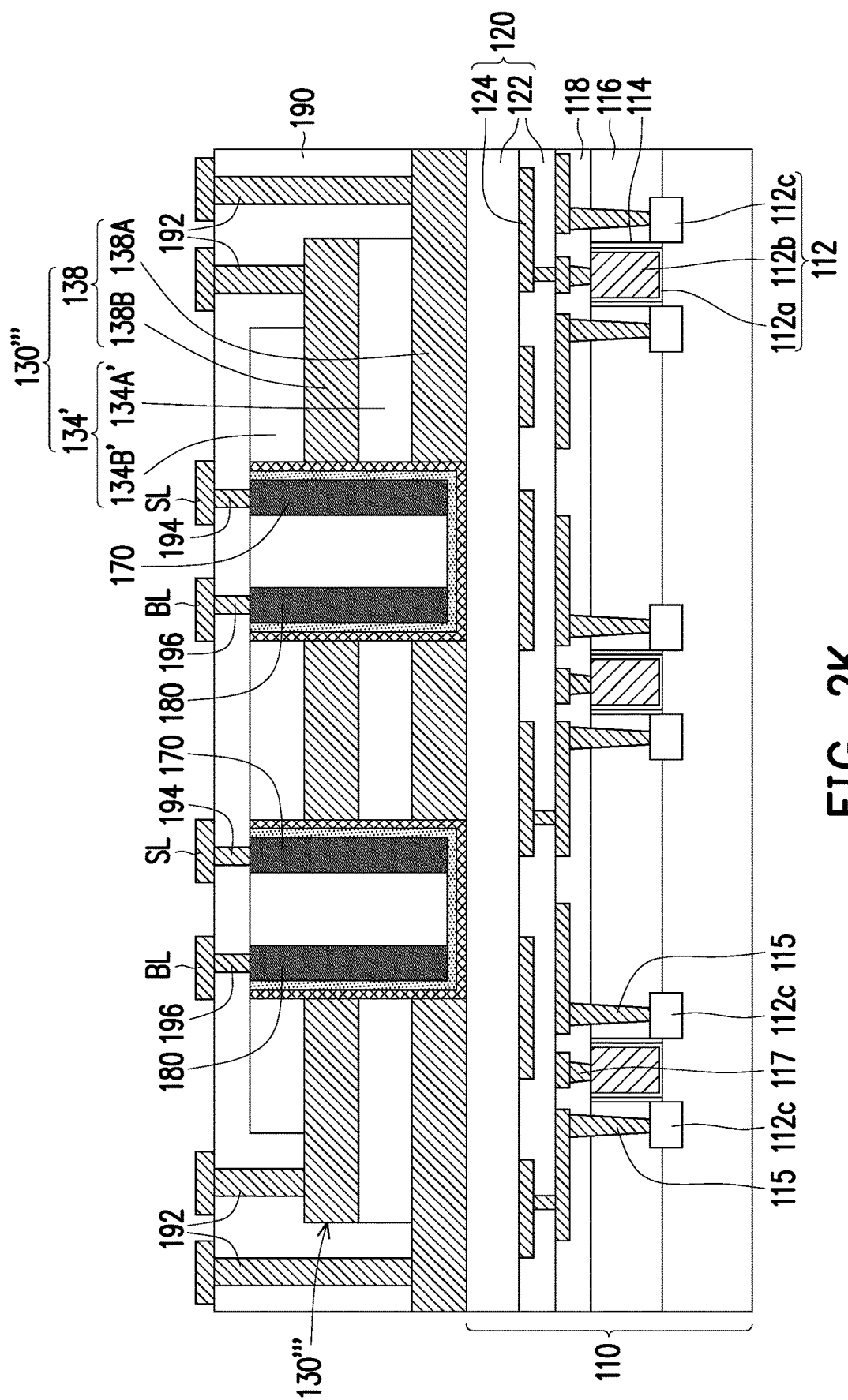

FIG. 2K is a cross-sectional view cutting along a cross-sectional line A-A' illustrated in FIG. 1L. Referring to FIG. 1L and FIG. 2K, an inter-metal dielectric (IMD) 190 is deposited over the strip-shaped stacking structures 130'". The IMD 190 may be formed of a dielectric material, and may be deposited by any suitable method, such as CVD, PECVD, flowable CVD (FCVD), or the like. The dielectric materials may include phospho-silicate glass (PSG), boro-silicate glass (BSG), boron-doped phospho-silicate glass (BPSG), undoped silicate glass (USG), or the like. In some embodiments, the IMD 190 may include an oxide (e.g., silicon oxide or the like), a nitride (e.g., silicon nitride or the like), a combination thereof or the like. Other dielectric materials formed by any acceptable process may be used. The IMD 190 extends along sidewalls of the dielectric patterns 134A', sidewalls of dielectric patterns 134B', sidewalls of the conductive lines 138A, and sidewalls of the conductive lines 138B. Further, the IMD 190 may contact and cover top surfaces of the dielectric patterns 134A' and 134B', and the IMD 190 may contact and cover top surfaces of the conductive lines 138A and 138B.

A removal process may be optionally performed to the IMD 190 to remove excess dielectric material over the strip-shaped stacking structures 130'". The removal process may be a planarization process, such as a chemical mechanical polish (CMP), an etch-back process, combinations thereof, or the like. The planarization process may expose the strip-shaped stacking structures 130'" such that top surfaces of the strip-shaped stacking structures 130'" and IMD 190 are level after the planarization process is performed.

After forming the IMD 190, word line contacts 192 and signal lines (e.g., source lines SL and bit lines BL) are formed over the IMD 190. The word line contacts 192 penetrate through the IMD 190 and electrically connected to the conductive lines (e.g., word lines) 138A and 138B. The source lines SL and contact vias 194 are formed over the IMD 190 and electrically connected to the source pillars (i.e. source electrodes) 170 through contact vias 194 embedded in the IMD 190. The bit lines BL are formed over the IMD 190 and electrically connected to the drain pillars (i.e. drain electrodes) 180 through contact vias 196 embedded in the IMD 190. As illustrated in FIG. 1L and FIG. 2K, the source lines SL and the bit lines BL are disposed at the same side of the conductive lines (e.g., word lines) 138A and 138B. In other words, the source lines SL and the bit lines BL are disposed over the strip-shaped stacking structures 130‴ and the IMD 190.

After forming the source lines SL and the bit lines BL, a 3D memory device including stacked memory cells is fabricated over the substrate 110. The 3D memory device may be fabricated and disposed in the back end of line (BEOL) of a semiconductor die. For example, the 3D memory device may be disposed in or over the interconnect structure of a semiconductor die.

Figure 3:
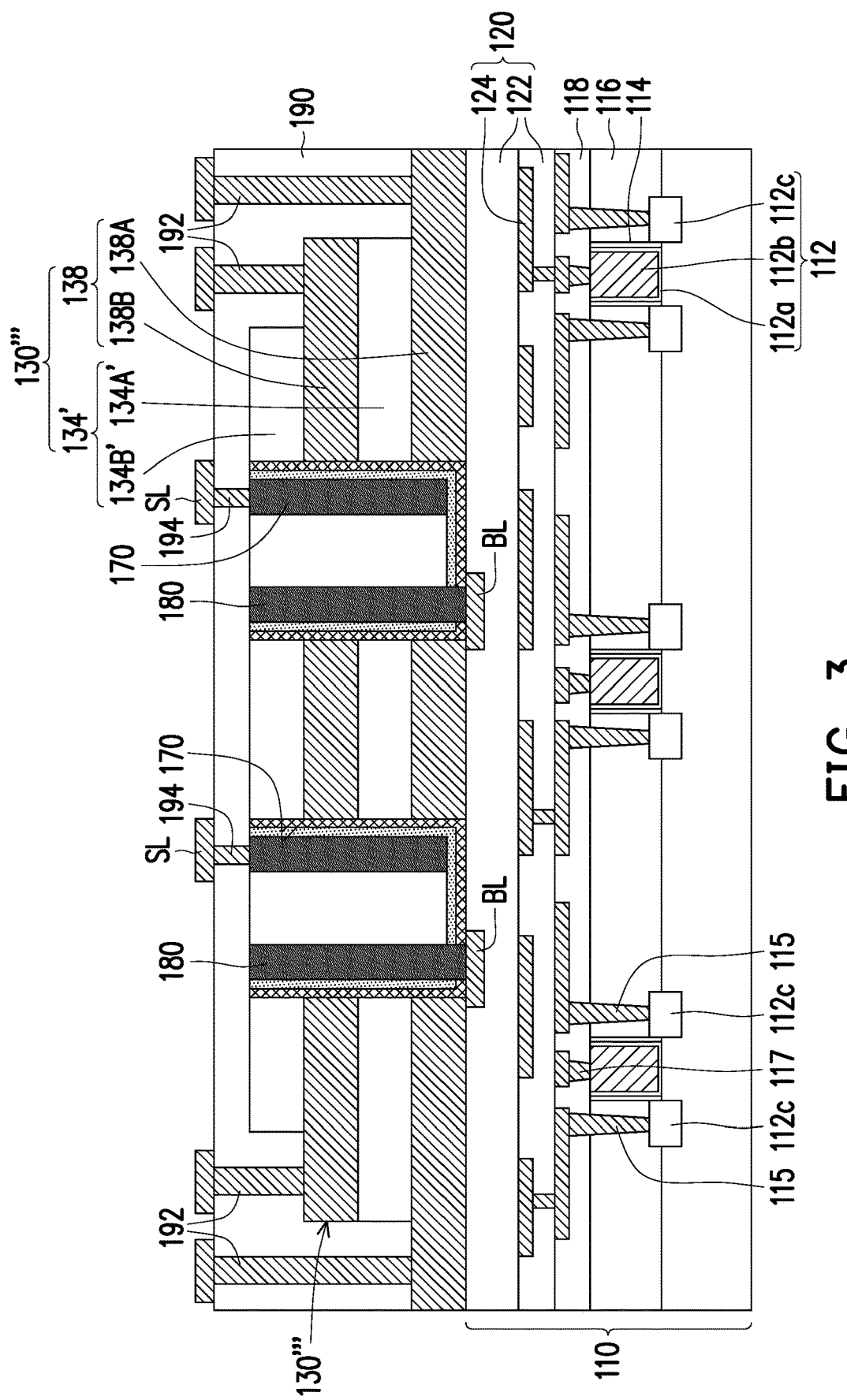
FIG. 3 schematically illustrates a cross-sectional view of a memory device in accordance with some alternative embodiments of the present application.
Figure 4:
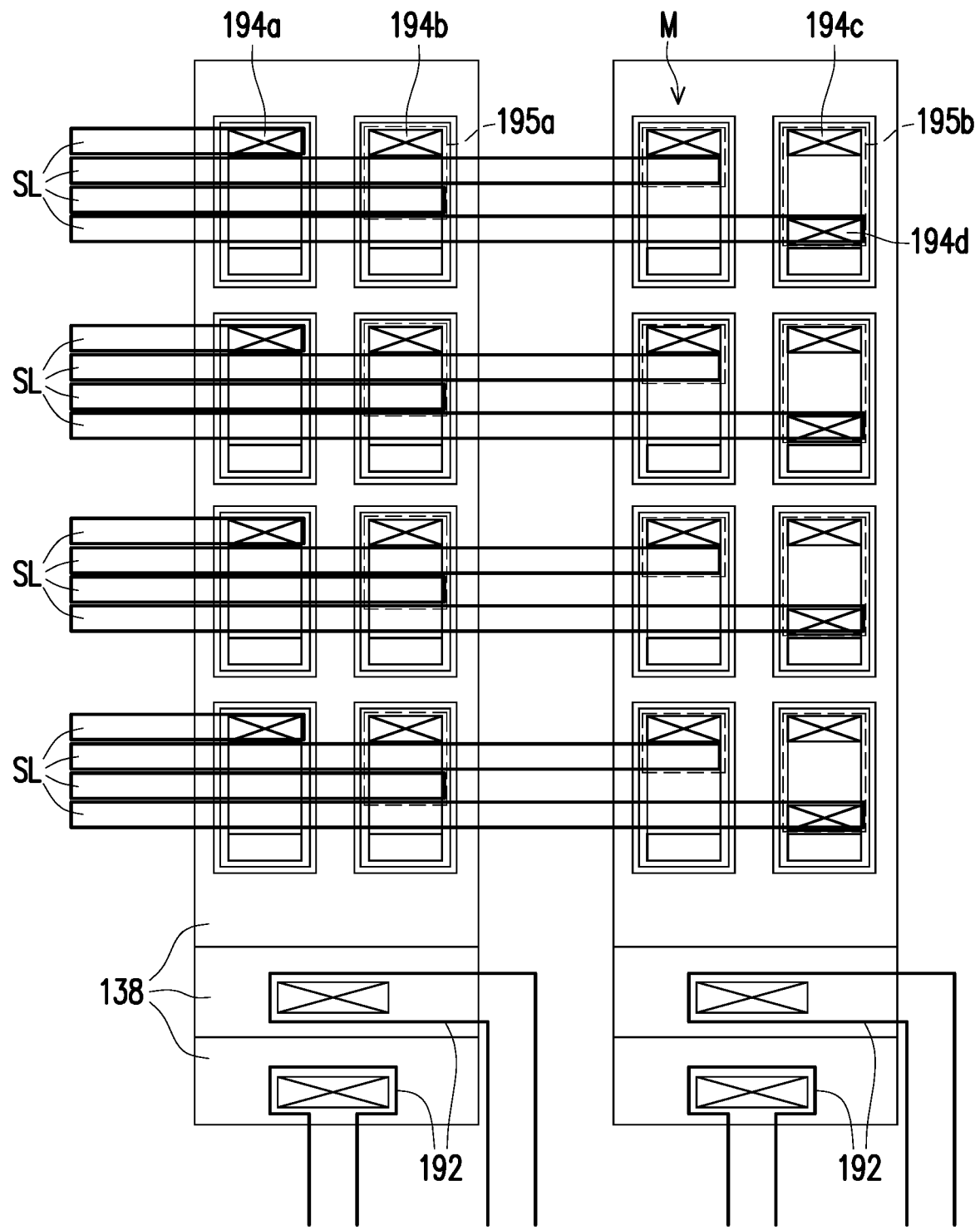
FIG. 4 schematically illustrates a top down view of a memory device in accordance with some embodiments of the present application.

FIG. 3 schematically illustrates a cross-sectional view of a memory device in accordance with some alternative embodiments of the present application. FIG. 4 schematically illustrates a top down view of a memory device in accordance with some embodiments of the present application.

Referring to FIG. 2K, FIG. 3 and FIG. 4, the memory device illustrated in FIG. 3 and FIG. 4 is similar to the memory device illustrated in FIG. 2K except that the source lines SL and the bit lines BL are disposed at two opposite sides of the conductive lines (e.g., word lines) 138A and 138B. In other words, the source lines SL are disposed over the strip-shaped stacking structures 130‴ and the IMD 190, and the bit lines BL are disposed under the strip-shaped stacking structures 130‴ and the IMD 190. In some embodiments, the bit lines BL are formed in the interconnect structure 120. In some alternative embodiments, the bit lines BL are formed between the stacked dielectric layers 122 (e.g., the bit lines BL are portions of the conductive features 124 sandwiched between the stacked dielectric layers 122), and the drain pillars 180 extend through an upper tier dielectric layer 122 among the stacked dielectric layers 122 so as to connect with the bit lines BL. As illustrated in FIG. 3, pillar-shaped apertures for accommodating the conductive pillars 170 and the conductive pillars 180 may be formed by two or more patterning processes. After performing the patterning processes, a conductive material may be filled into the pillar-shaped apertures. The conductive material may include copper, titanium, titanium nitride, tantalum, tantalum nitride, tungsten, ruthenium, aluminum, combinations thereof, or the like, which may be formed using, for example, CVD, ALD, PVD, PECVD, or the like. After the conductive material is deposited, a planarization (e.g., a CMP, etch back, or the like) may be performed to remove excess portions of the conductive material, thereby forming the conductive pillars 170 and the conductive pillars 180.

As illustrated in FIG. 4, in some embodiments, electrical connection between the source lines SL and the source pillars 170 may be achieved through a single contact via 194a. In some alternative embodiments, electrical connection between the source lines SL and the source pillars 170 may be achieved through a contact via 194b and a redistribution wiring 195a. In some other embodiments, electrical connection between the source lines SL and the source pillars 170 may be achieved through a redistribution wiring 195b, contact via 194c and contact vias 194d, wherein the level height of the contact via 194c is lower than the level height of contact vias 194d, and the level height of the redistribution wiring 195b is between the level height of the contact via 194c and the level height of contact vias 194d.

Figure 5:
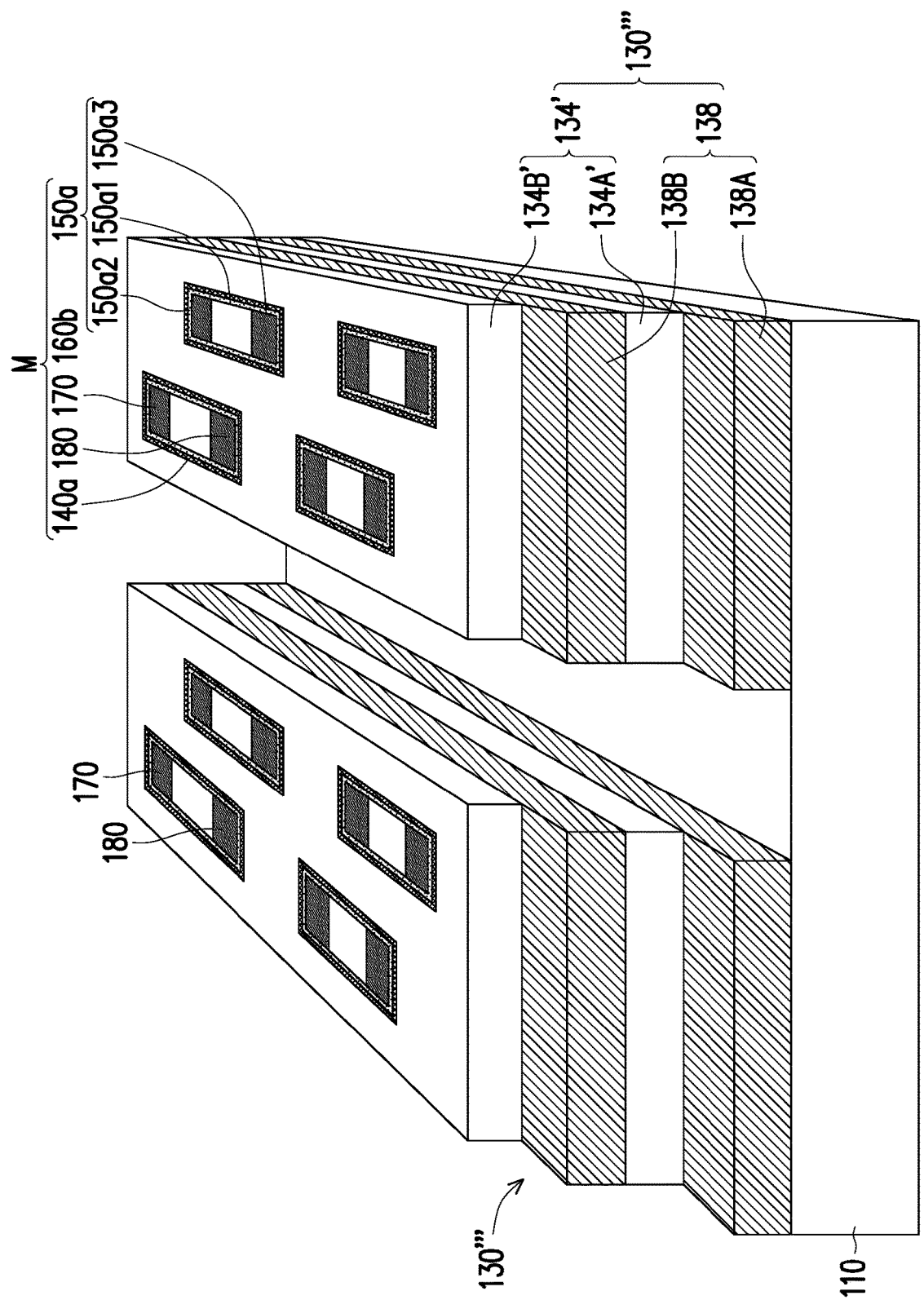
FIG. 5 schematically illustrates a perspective view of a memory device in accordance with some alternative embodiments of the present application.
Figure 6:
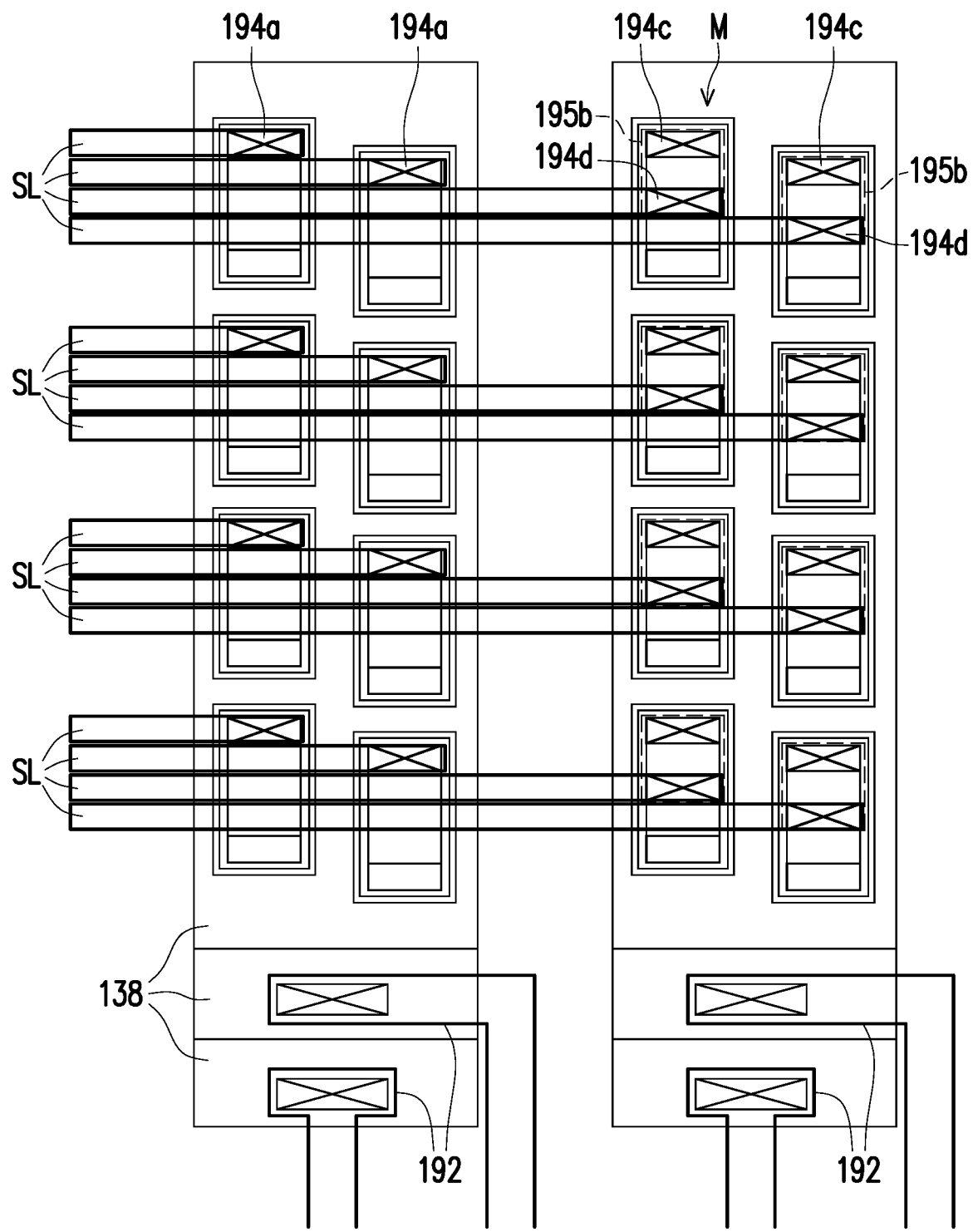
FIG. 6 schematically illustrates a top down view of a memory device in accordance with some alternative embodiments of the present application.

FIG. 5 schematically illustrates a perspective view of a memory device in accordance with some alternative embodiments of the present application. FIG. 6 schematically illustrates a top down view of a memory device in accordance with some alternative embodiments of the present application.

Referring to FIG. 1K, FIG. 5 and FIG. 6, the memory device illustrated in FIG. 5 and FIG. 6 is similar to the memory device illustrated in FIG. 1K except that the memory cells M formed in the strip-shaped stacking structures 130‴ are classified into multiple columns of memory cells M, and the columns of memory cells M are not aligned in the row direction.

An embodiment of the present invention relates to a memory device including a word line, memory cells, source lines and bit lines is provided. The memory cells are embedded in and penetrate through the word line. The source lines and the bit lines are electrically connected the memory cells. In some embodiments, at least one memory cell among the memory cells includes a source pillar, a drain pillar, an isolation structure, a channel layer and a charge storage dielectric layer. The source pillar is embedded in and penetrating through the word line. The drain pillar is embedded in and penetrating through the word line. The isolation structure is embedded in and penetrating through the word line, wherein the source pillar and the drain pillar are spaced apart by the isolation structure, the source pillar is electrically connected to one of the source lines, and the drain pillar is electrically connected to one of the bit lines. The channel layer and the charge storage dielectric layer laterally surround the source pillar, the drain pillar and the isolation structure, and the channel layer is spaced apart from the word line by the charge storage dielectric layer. In some embodiments, the source pillar is spaced apart from the charge storage dielectric layer by a first contact portion of the channel layer, and the drain pillar is spaced apart from the charge storage dielectric layer by a second contact portion of the channel layer. In some embodiments, the isolation structure is spaced apart from the charge storage dielectric layer by channel portions of the channel layer. In some embodiments, the source lines and the bit lines are disposed at a same side of the word line. In some embodiments, the source lines and the bit lines are disposed at two opposite sides of the word line. In some embodiments, the channel layer is in contact with sidewalls of the source pillar, sidewalls of the drain pillar and sidewalls of the isolation structure. In some embodiments, an inner sidewall of the charge storage dielectric layer is in contact with the channel layer, and an outer sidewall of the charge storage dielectric layer is in contact with the word line. In some embodiments, the charge storage dielectric layer comprises a ferroelectric layer.

Another embodiment of the present invention relates to a memory device including strip-shaped stacking structures, pillar-shaped structures and signal lines. The strip-shaped stacking structures each includes conductive lines and dielectric patterns stacked alternately. The pillar-shaped structures penetrate through the conductive lines and the dielectric patterns of the strip-shaped stacking structure, and each of the pillar-shaped structures includes a first conductive pillar; a second conductive pillar; an isolation structure disposed between the first conductive pillar and the second conductive pillar; an oxide semiconductor layer; and a charge storage dielectric layer, wherein the oxide semiconductor layer and the charge storage dielectric layer laterally surround the first conductive pillar, the second conductive pillar and the isolation structure, and the charge storage dielectric layer is disposed between the oxide semiconductor layer and one of the strip-shaped stacking structures. The signal lines are electrically connected to the first and second conductive pillars. In some embodiments, the conductive lines serve as gate electrodes of transistors, the first conductive pillars serve as source electrodes of the transistors, and the second conductive pillars serve as drain electrodes of the transistors. In some embodiments, the signal lines comprise source lines electrically connected the first conductive pillars and bit lines electrically connected the second conductive pillars. In some embodiments, the source lines and the bit lines are disposed at two opposite sides of the strip-shaped stacking structures. In some embodiments, the source lines and the bit lines are disposed at a same side of the strip-shaped stacking structures. In some embodiments, each of the strip-shaped stacking structures comprises a staircase configuration, and lower tier conductive lines in the staircase configuration are longer than and extend laterally past endpoints of upper tier conductive lines in the staircase configuration.

An alternative embodiment of the present invention relates to a method for fabricating a memory device. The method includes the following steps. A dielectric stack including first dielectric layers and second dielectric layers stacked alternately is formed. Through holes are formed in the dielectric stack. Each one of the through holes are filled with a charge storage dielectric layer, a channel layer and an insulating material, wherein the channel layer is between the charge storage dielectric layer and the insulating material. The dielectric stack is patterned to form first strip-shaped stacking structures, wherein each of the first strip-shaped stacking structures comprises first dielectric patterns and second dielectric patterns stacked alternately. The second dielectric patterns of the first strip-shaped stacking structures are removed. Conductive layers are formed between the first dielectric patterns to form second strip-shaped stacking structures each including the conductive layers and the first dielectric patterns stacked alternately. After forming the second strip-shaped stacking structures, the insulating material in each one of the through holes is partially removed to form an isolation structure and pillar-shaped apertures spaced apart from each other by the isolation structure. Source pillars and drain pillars are formed in the pillar-shaped apertures. In some embodiments, the memory cells are formed over or in an interconnect structure of a semiconductor die. In some embodiments, portions of the charge storage dielectric layer are revealed after removing the second dielectric patterns of the first strip-shaped stacking structures. In some embodiments, the conductive layers between the first dielectric patterns are formed through a deposition process followed by an etch process. In some embodiments, the method further includes forming source lines and bit lines, wherein the source lines and the bit lines are electrically connected the memory cells embedded in the second strip-shaped stacking structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a word line;
memory cells embedded in and penetrating through the word line;
source lines electrically connected the memory cells; and
bit lines electrically connected the memory cells, wherein each of the memory cells comprises:
a source pillar embedded in and penetrating through the word line;
a drain pillar embedded in and penetrating through the word line;
an isolation structure embedded in and penetrating through the word line, wherein the source pillar and the drain pillar are spaced apart by the isolation structure, the source pillar is electrically connected to one of the source lines, and the drain pillar is electrically connected to one of the bit lines; and
a channel layer and a charge storage dielectric layer, wherein the channel layer and the charge storage dielectric layer laterally surround the source pillar, the drain pillar and the isolation structure, and the channel layer is spaced apart from the word line by the charge storage dielectric layer,
wherein the perimeter of each of the source pillar and the drain pillar is enclosed by the isolation structure and the channel layer, and
wherein the isolation structure comprises a single material.

2. The memory device as claimed in claim 1, wherein a first memory cell among the memory cells and a second memory cell among the memory cells are arranged in a lengthwise direction of the word line, and the first memory cell is laterally spaced apart from the second memory cell by the word line in the lengthwise direction.

3. The memory device as claimed in claim 1, wherein the source pillar is spaced apart from the charge storage dielectric layer by a first contact portion of the channel layer, the isolation structure is spaced apart from the charge storage dielectric layer by channel portions of the channel layer, and the drain pillar is spaced apart from the charge storage dielectric layer by a second contact portion of the channel layer.

4. The memory device as claimed in claim 3, wherein the channel portions are substantially paralleled with parts of the first contact portion and parts of the second contact portion.

5. The memory device as claimed in claim 1, wherein the source pillar comprises a rectangular pillar, the drain pillar comprises a rectangular pillar, and the isolation structure comprises a rectangular pillar.

6. The memory device as claimed in claim 1, wherein the channel layer is in contact with sidewalls of the source pillar, sidewalls of the drain pillar and sidewalls of the isolation structure.

7. The memory device as claimed in claim 1, wherein an inner sidewall of the charge storage dielectric layer is in contact with the channel layer, and an outer sidewall of the charge storage dielectric layer is in contact with the word line.

8. The memory device as claimed in claim 1, wherein the charge storage dielectric layer comprises a ferroelectric layer.

9. The memory device as claimed in claim 1, wherein a contact area between the source pillar and the channel layer is greater than a contact area between the source pillar and the isolation structure, and a contact area between the drain pillar and the channel layer is greater than a contact area between the drain pillar and the isolation structure.

10. A memory device, comprising:
- strip-shaped stacking structures each comprising conductive lines and dielectric patterns stacked alternately;
- pillar-shaped structures penetrating through the conductive lines and the dielectric patterns of the strip-shaped stacking structures, and each of the pillar-shaped structures comprising:
  - a first conductive pillar;
  - a second conductive pillar;
  - an isolation structure disposed between the first conductive pillar and the second conductive pillar, wherein the isolation structure comprises a single material between the first conductive pillar and the second conductive pillar;
  - an oxide semiconductor layer and a charge storage dielectric layer, wherein the oxide semiconductor layer and the charge storage dielectric layer laterally surround the first conductive pillar, the second conductive pillar and the isolation structure, the charge storage dielectric layer is disposed between the oxide semiconductor layer and one of the strip-shaped stacking structures, and
  - wherein the perimeter of each of the first conductive pillar and the second conductive pillar is enclosed by the isolation structure and the oxide semiconductor layer; and
- signal lines electrically connected to the first conductive pillar and the second conductive pillar.

11. The memory device as claimed in claim 10, wherein the conductive lines serve as gate electrodes of transistors, the first conductive pillars serve as source electrodes of the transistors, and the second conductive pillars serve as drain electrodes of the transistors.

12. The memory device as claimed in claim 11, wherein the signal lines comprise source lines electrically connected the first conductive pillars and bit lines electrically connected the second conductive pillars.

13. The memory device as claimed in claim 12, wherein the source lines and the bit lines are disposed at a same side of the strip-shaped stacking structures.

14. The memory device as claimed in claim 10, wherein each of the strip-shaped stacking structures comprises a staircase configuration, and lower tier conductive lines in the staircase configuration are longer than and extend laterally past endpoints of upper tier conductive lines in the staircase configuration.

15. The memory device as claimed in claim 10, wherein a contact area between the second pillar and the oxide semiconductor layer is greater than a contact area between the second pillar and the isolation structure.

* * * * *